(12) United States Patent
Hattori et al.

(10) Patent No.: US 6,413,687 B1
(45) Date of Patent: Jul. 2, 2002

(54) TRANSFER FOIL AND IMAGE RECORDING MATERIAL, AND METHOD FOR PREPARING IMAGE RECORDING MATERIAL

(75) Inventors: Ryoji Hattori; Shigehiro Kitamura; Hideki Takahashi; Seiji Hidaka, all of Tokyo (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 09/705,225

(22) Filed: Nov. 2, 2000

(30) Foreign Application Priority Data

Nov. 10, 1999 (JP) .............................. 11-320148

(51) Int. Cl.[7] .................. G03C 11/08; G03C 11/12; G03C 1/805; B44C 1/165; B32B 15/04

(52) U.S. Cl. ..................... 430/10; 430/2; 430/259; 430/262; 430/263; 430/403; 156/239; 428/323; 428/327; 428/336; 428/352; 428/914

(58) Field of Search .................. 430/10, 259, 262, 430/263, 403, 2; 156/239; 428/352, 323, 327, 336, 914

(56) References Cited

U.S. PATENT DOCUMENTS

| | | | | |
|---|---|---|---|---|
| 4,525,416 A | * | 6/1985 | Hammerschmidt et al. | 428/352 |
| 5,286,597 A | * | 2/1994 | Suzuki et al. | 430/259 |
| 5,541,035 A | * | 7/1996 | Omote et al. | 430/257 |
| 5,976,762 A | * | 11/1999 | Takayanagi | 430/262 |
| 6,060,210 A | * | 5/2000 | Eda et al. | 430/259 |
| 6,264,782 B1 | * | 7/2001 | Oshima et al. | 156/239 |

* cited by examiner

*Primary Examiner*—Richard L. Schilling
(74) *Attorney, Agent, or Firm*—Frishauf, Holtz, Goodman & Chick, P.C.

(57) ABSTRACT

A transfer foil for image transfer comprising a support, a releasing layer and a component layer is disclosed. The releasing layer contains inorganic or organic fine particles and 1<(average particle diameter of the inorganic or organic fine particle in releasing layer/thickness of releasing layer)×100<400.

7 Claims, 10 Drawing Sheets

TRANSFER FOIL AND IMAGE RECORDING MATERIAL, AND METHOD FOR PREPARING IMAGE RECORDING MATERIAL

FIELD OF THE INVENTION

The present invention relates to an image recording material and a transfer foil which are suitably applied to a contact- or non-contact type electronic or magnetic card, sheet, and the like, which store personal information and the like for which security is demanded to prevent forgery, altetration and the like.

BACKGROUND OF THE INVENTION

In recent years, contact- or non-contact-type electronic or magnetic cards, and the like, have increasingly been issued in the field of service industry such as banks, business organizations, educational institutions, public agencies, and the like. Personal information such as a portrait, a name, and the like, is recorded on image recording bodies such as cash cards, employee cards, company membership cards, membership cards, student cards, aliens registration cards, various types of license cards, and the like, which are employed in various fields. Accordingly, these cards are subjected to security treatment so that forgery as well as altetration is not readily carried out.

For example, a hologram layer is provided onto a card substrate and a special image is formed so that a portrait, a name, issue date, and the like are not readily imitated. Said image is generally called a diffraction grating image or a hologram image. Said hologram image is formed employing interference infringes obtained by overlapping waves which are reflected from a body or transmitted through a body with the reference waves. By employing said hologram image, the image of the body is stereoscopically reproduced. The surface of the hologram layer is covered with a protective sheet having high light transmission. Employed as said protective sheet are transparent resins and the like which are employed for lamination, and the hologram layer, which exhibits less strength than the card substrate, is covered with the protective sheet and thereby protected.

SUMMARY OF THE INVENTION

However, according to the method for producing cards using the conventional system, for instance, a laminate film and a hologram sheet are separately formed, and after passing through a laminating process, the extra laminate film is trimmed. Specifically for photo-bearing company membership cards, driver's license cards, and the like, in order to ensure positive identification with a flawless image, it is necessary that during the production process, the formation of scratches as well as wrinkling on the surface of the card is minimized, and further, that while cutting the film into a card shape, the generation of fins in the projected area which sticks out to the edges is prevented.

The present invention has overcome the aforementioned problems. An object of the present invention is to provide a transfer foil and an image recording material which enhance security by discouraging forgery, alteration, and the like, and which exhibit improved scratch resistance, are capable of minimizing the formation of scratches as well as winkling, and are capable of decreasing the formation of fins, and a method for preparing said image recording material.

SUMMARY OF THE INVENTION

In order to overcome the aforementioned problems and to achieve the object, the present invention is embodied as described below.

A transfer foil comprising a support, a releasing layer and a component layer wherein the releasing layer contains inorganic or organic fine particles and 1<(average particle diameter of the inorganic or organic fine particle in releasing layer/thickness of releasing layer)×100<400.

The inorganic or organic fine particles preferably comprise a heat cross linking group or a light cross linking group.

In the transfer foil an average particle diameter of the inorganic or organic fine particles is preferably 0.01 to 10 μm In the transfer foil the heat cross linking group or the light cross linking group preferably comprises at least a vinyl group, an acryloyl group, a methacryloyl group, a glycidyl group, an isocyanate group, or a carboxyl group.

In the transfer foil the component layer preferably includes at least one of adhesion layer, a transparent protective layer and an optical variable device layer.

An image recording material having a component layer transferred from a transfer foil to a support for image recording material comprising a support for an image recording material, an image receiving layer forming an image, a releasing layer and a component layer, wherein the releasing layer contains inorganic or organic fine particles and 1<(average particle diameter of the inorganic or organic fine particle in releasing layer/thickness of releasing layer)×100<400.

A method of forming an image recording material comprising steps of recording an image on the image receiving layer provided on a support for forming an image recording material, transferring a component layer of a transfer foil onto an image receiving layer having a recorded image, wherein the transfer foil comprises a releasing layer, the releasing layer contains inorganic or organic fine particles and 1<(average particle diameter of the inorganic or organic fine particle in releasing layer/thickness of releasing layer)×100<400.

DETAILED DESCRIPTION OF THE PREFERRED EMBODIMENTS

The invention described in claim 1 is "a transfer foil characterized in comprising a support having thereon a layer which contains inorganic or organic fine particles comprising a heat and/or a light cross linking group."

A transfer foil characterized in comprising a support having thereon a layer which contains inorganic or organic fine particles having an average particle diameter of 0.01 to 10 μm, comprising a heat and/or light cross linking group.

A transfer foil described above, characterized in that said heat and/or light cross linking group comprises at least a vinyl group, an acryloyl group, a methacryloyl group, a glycidyl group, an isocyanate group, or a carboxyl group.

A transfer foil described above, characterized in that inorganic or organic fine particles comprising a heat and/or light cross linking group are incorporated into at least a releasing layer and a light or heat hardening layer.

A transfer foil described above, characterized in comprising a transparent protective layer and/or an optical variable device layer transfer layer.

A transfer foil characterized in that in a transfer foil comprising at least one releasing layer, the general formula described below is held.
(General Formula I)

Average particle diameter of the fine inorganic or organic particle in releasing layer/thickness of releasing layer×100=1.0 to 400

An image recording material characterized in comprising the transfer foil described above on an image recording layer.

A method for preparing an image recording material characterized in that the transfer foil described above is transferred at least one time.

According to the image recording material and the transfer foil, the method for preparing said image recording material, and the method for producing said transfer foil of the present invention, security against forgery, alteration, and the like, is enhanced. At the same time, scratch resistance is enhanced and the formation of flaws and wrinkles are minimized.

In addition, when said image recording material is cut into a card shape, it is possible to minimize the formation of fins of stuck-out parts along the edge.

Figure 1:
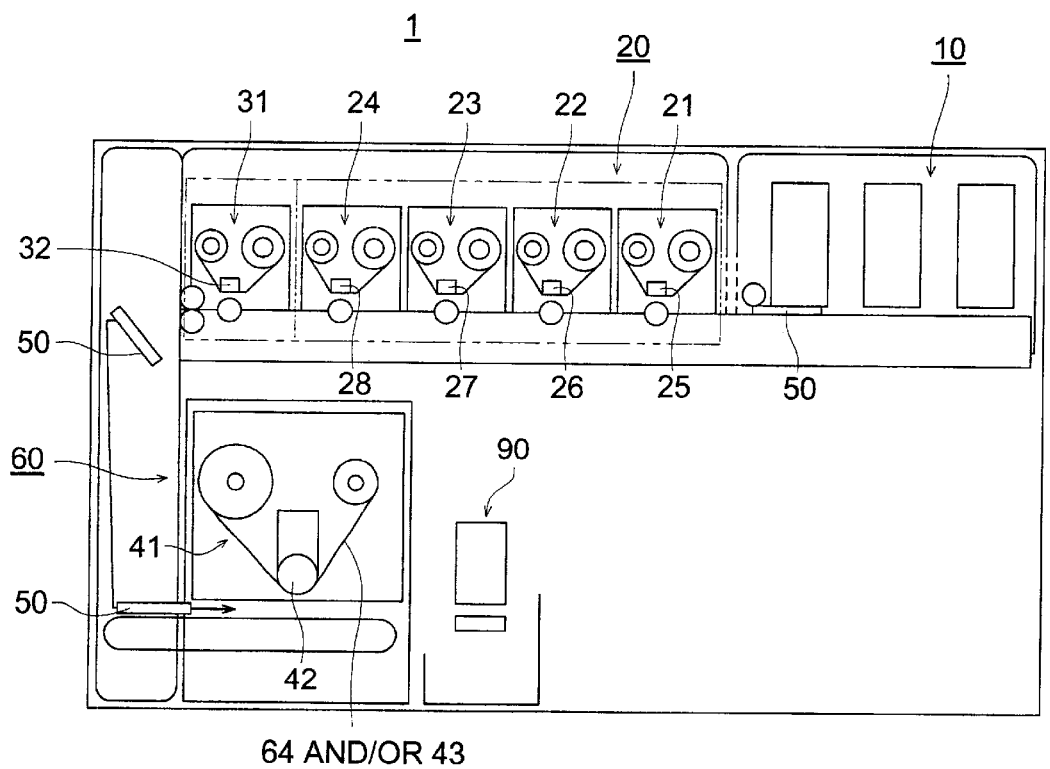
FIG. 1 is a schematic structural view showing an image recording material preparation apparatus of the first embodiment.
Figure 2:
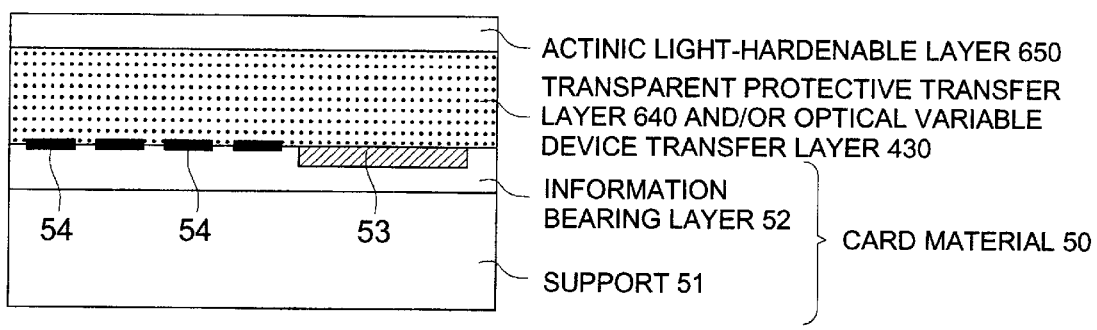
FIG. 2 is a view showing a layer configuration of an image recording material.

The embodiments of the image recording material, the transfer foil, the transfer foil roll, the preparation method of the image recording material, and the production method for the transfer foil of the present invention will now be described below with reference to the drawings. However, the present invention is not limited to these embodiments, description and drawings. First, FIGS. 1 and 2 show an image recording material preparation apparatus of the first embodiment. FIG. 1 is a schematic structural view of the image recording material preparation apparatus, while FIG. 2 is a view showing the layer structure of an image recording material.

The transfer foil of the present invention comprises a support having thereon a releasing layer and at least one component layer. Further, said releasing layer comprises inorganic or organic fine particles. Still further, the general formulas described below are held:

1<(average diameter of said fine particles/thickness of said releasing layer)×100<400.

Further, the above general formula is more preferably:

2<(average diameter of said fine particles/thickness of said releasing layer)×100<300;

and the above general formula is more preferably:

3<(average diameter of said fine particles/thickness of said releasing layer)×100<150;

and the above general formula is further more preferably:

4<(average diameter of said fine particles/thickness of said releasing layer)×100<150.

Further, in order to protect an image recorded on an image recording material, the transfer foil of the present invention is preferably employed for the purpose of transferring a protective layer onto an image recorded on said image recording material. The releasing layer as described herein is the layer which is provided so that a component layer is readily peeled off from the support of the transfer foil. Incidentally, when said component layer is peeled from the support of the transfer foil, the entire releasing layer may remain on the support (namely, the releasing layer is not transferred onto the image recording material). Alternatively, one part of the releasing layer may be transferred onto the support, while the other part of the same remains on said component layer.

Further, said component layer possesses various functions and may be comprised of a single layer or a plurality of layers. Incidentally, preferable examples of said component layer include a transparent protective layer which protects images on the image recording material, a transparent hardening layer which is previously hardened by the irradiation of actinic light to protect images on the image recording material, an adhesive layer which is employed for adhering the transfer foil onto the image recording material, an optical variable device layer which varies optical performance, a barrier layer, a cushion layer, an interlayer, and the like. Further, said interlayer is preferably provided, for example, to enhance the adhesion between component layers. Accordingly, said interlayer is frequently provided between the adhesive layer and the transparent protective layer. Specifically, said component layer preferably comprises at least one of the adhesive layer, the transparent protective layer, and the optical variable device layer.

Further, fine particles preferably have a heat cross linking group and/or a light cross linking group. Still further, fine particles may be covered with a resin having a heat cross linking group and/or a light cross linking group, and a heat cross linking group and/or a light cross linking group may be provided on the surface of fine organic or inorganic particles utilizing chemical reaction. Still further, the average diameter of said fine particles is between 0.01 and 10 μm. Still further, said heat cross linking group and/or said light cross linking group includes at least a vinyl group, a methacryloyl group, an acryloyl group, a glycidyl group, an isocyanate group, and carboxyl group. When said fine particles having a heat cross linking group and/or a light cross linking group are employed, it is preferable that the component layer comprises a hardening layer which is adjacent to the releasing layer, because the effects of the present inventing are pronounced. It is more preferable that when the component layers are peeled from the support of the transfer foil, all component layers are peeled off (namely, the releasing layer is transferred onto the image recording material).

The fine particles comprising heat cross linking group and/or light cross linking group may be contained in a layer other than the releasing layer. Content of the fine particles in the releasing layer is preferably 0.001 to 25 wt %, more preferably 0.05 to 25 wt %, and particularly preferably 0.1 to 25 wt % of the solid component of the releasing layer.

Thickness of the support for the transfer foil is preferably 1 to 50 $\mu$m. more preferably 10 to 50 $\mu$m. and particularly preferably 10 to 30 $\mu$m. Thickness of the releasing layer is preferably 0.0001 to 2 $\mu$m more preferably 0.0005 to 3 $\mu$m. and particularly preferably 0.001 to 2 $\mu$m. Thickness of the component layer is preferably 0.1 to 50 $\mu$m, more preferably 0.5 to 50 $\mu$m, and particularly preferably 0.8 to 30 $\mu$m.

In image recording material preparation apparatus 1 in the present embodiment, card material supply section 10 and information recording-section 20 are arranged at an upper position, and protection-providing section and/or optical variable device providing section 60, actinic light-hardened layer providing section and/or actinic light irradiating section 90 are arranged at a lower position. Apparatus 1 is capable of preparing cards as well as sheets as the image recording material.

In card material supplying section 10, in order to write personal information of a card user, a plurality of previously cut sheets of card material 50 are stored while the surface on which a portrait is recorded faces upward. In the present example, card material 50 is comprised of support 51 and information bearing layer 5. Each sheet of said card material 50 is automatically supplied at predetermined timing from card material supplying section 10.

In information recording section 20, yellow ribbon cassette 21, magenta ribbon cassette 22, cyan ribbon cassette 23, and black ribbon cassette 24 are arranged, and recording heads 25 through 28, corresponding to each ribbon cassette, are arranged. While the card material 50 is being conveyed, an images with gradation, such as the portrait of a card user, and the like, are recorded on image region 53 through thermal transfer employing thermal transfer sheets such as a yellow ribbon, magenta ribbon, cyan ribbon, and the like. Further, text ribbon cassette 31 and recording head 32 are arranged, and identification information 54 is recorded through thermal transfer employing a text ribbon and the like. Thus, an image recording layer is formed.

In the protection providing section and/or the optical variable device providing section 60, transfer foil cassette 41 is arranged and thermal transfer head 42 is arranged corresponding to said transfer foil cassette 41. Transparent protective transfer foil 64 and/or optical variable device transfer foil 43 is thermally transferred and transparent protective transfer layer 640 and/or optical variable device transfer layer 430 is provided.

Figure 11:
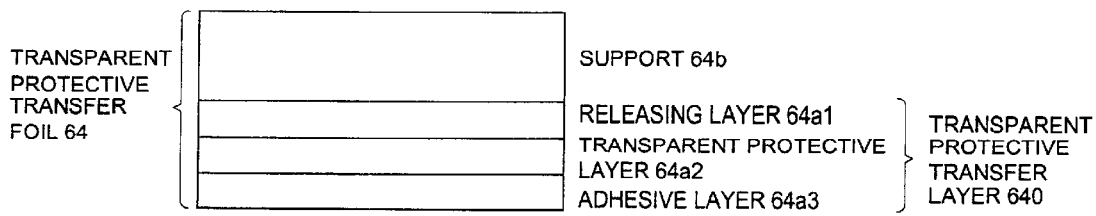
FIG. 11 is a view showing an embodiment of a transparent protective transfer foil.
Figure 11:
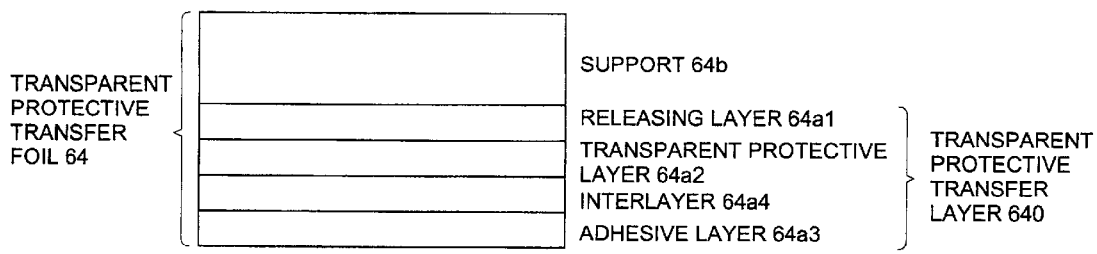
Figure 11:
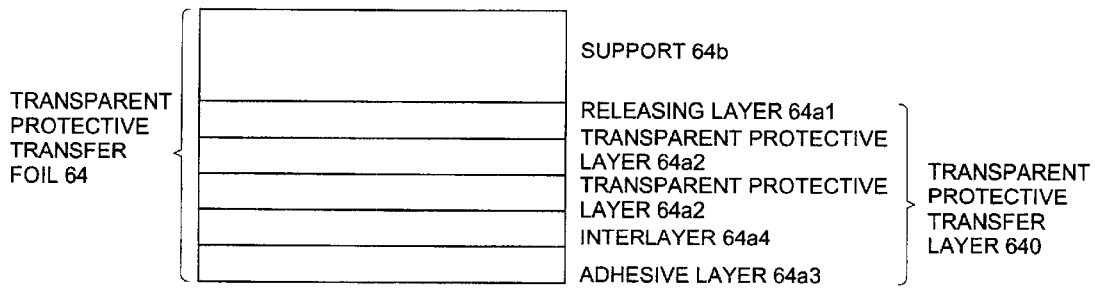
Figure 11:
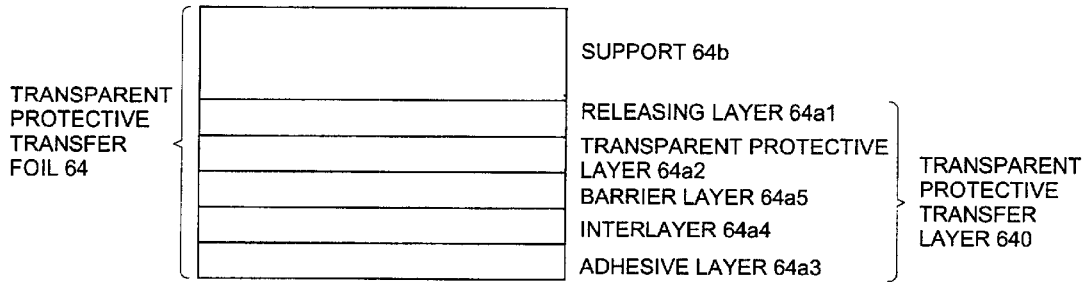
Figure 12:
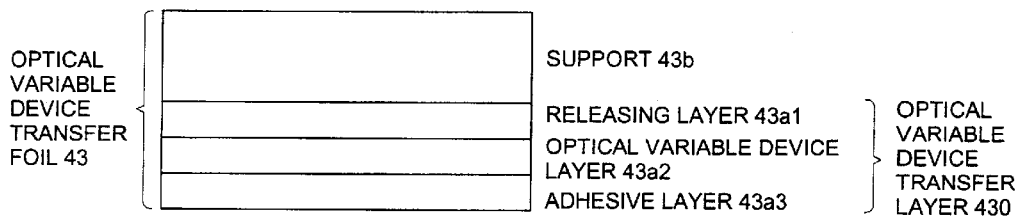
FIG. 12 is a view showing an embodiment of an optical variable device transfer foil.
Figure 12:
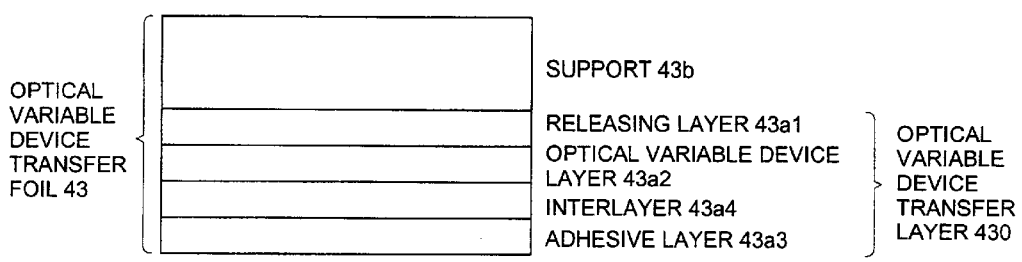
Figure 12:
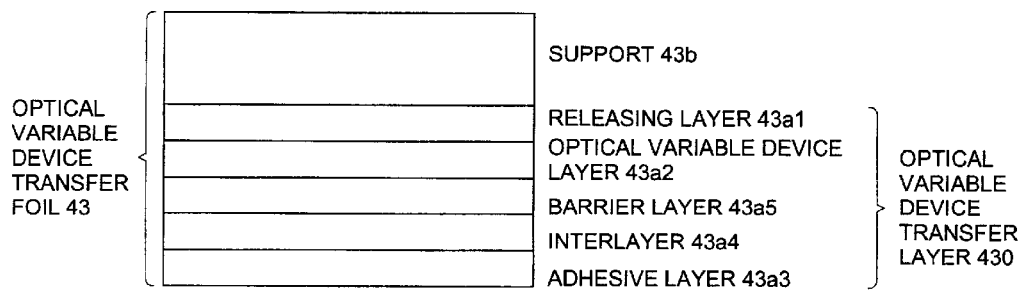
Figure 12:
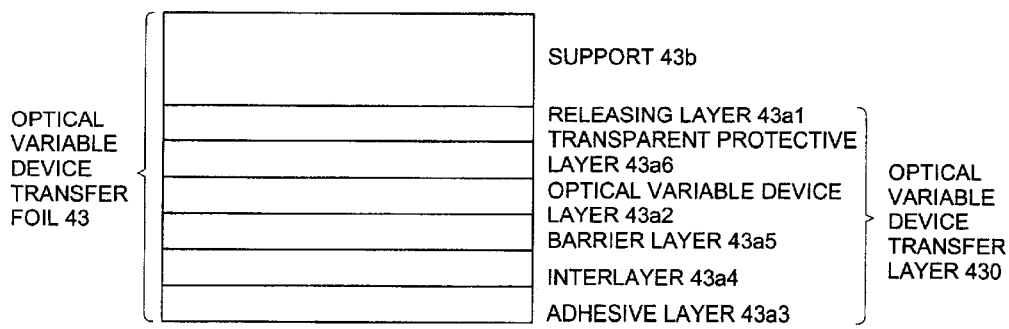

Incidentally, as shown in FIGS. 11(*a*) through 11(*d*), transparent protective layer transfer layer 640 comprises the releasing layer, the transparent protective layer, the adhesive layer and other layers, which is transferred to the image recording material from the transfer foil. Further, as shown in FIGS. 12(*a*) through 11(*d*), optical variable device layer 430 comprises the releasing layer, the optical variable device layer, the adhesive layer, and other layers, which is transferred to the image recording material from the transfer foil.

Thereafter actinic light-hardened layer 650 is coated employing actinic light-hardened layer providing section and/or actinic light irradiating section 90, and exposure is carried out employing actinic light. The layer structure of the image recording material as structured in FIG. 2 is then obtained, and actinic light-hardened coating layer 650 is provided on transparent protective transfer layer 640 and/or optical variable device transfer layer 430. The actinic light-hardened coating layer is a layer which is provided by coating the actinic light-hardenable coating composition and then hardening it by actinic light.

Figure 3:
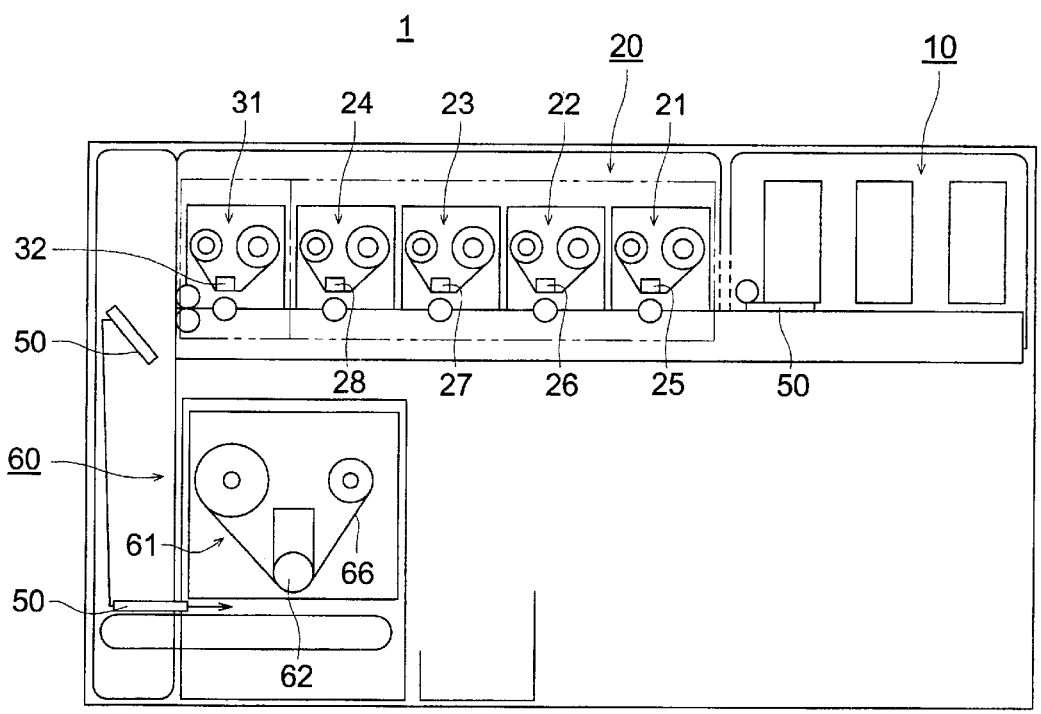
FIG. 3 is a schematic structural view showing an image recording material preparation apparatus of the second embodiment.
Figure 4:
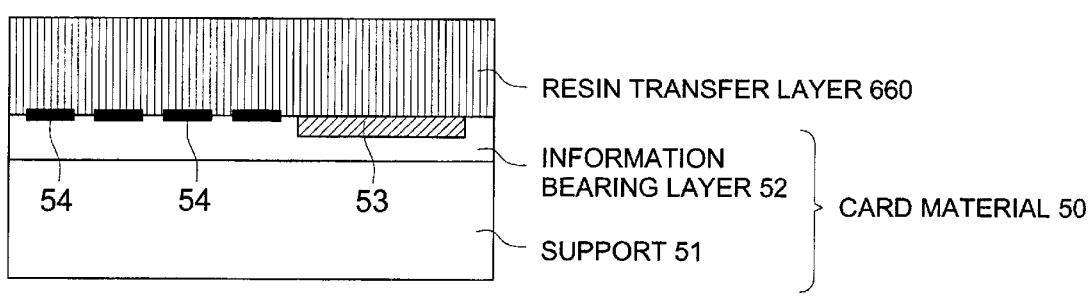
FIG. 4 is a view showing a layer configuration of an image recording material.

Next, FIGS. 3 and 4 show an image recording material preparation apparatus of the second embodiment. FIG. 3 is a schematic structural view of said image recording material preparation apparatus, and FIG. 4 shows the layer structure of said image recording material.

In image recording material preparation apparatus 1 of this embodiment, card supplying section 10 as well as image recording section 20 is constituted in the same manner. However, resin providing section 60 is arranged following information recording section 20.

In resin providing section 60, transfer foil cassette 61 is arranged, and thermal transfer head 62, corresponding to said transfer foil cassette 61, is arranged. Resin transfer foil 66 is placed in transfer foil cassette 61, and hardenable protective layer containing transfer layer 660 is provided upon transferring of said resin transfer foil 66. The hardenable protective layer containing transfer layer 660 is a layer which comprises a releasing layer, hardenable layer, adhesive layer etc., and is transferred from transfer foil to image recording material as demonstrated in FIGS. 13(*a*) to 13(*c*).

Figure 5:
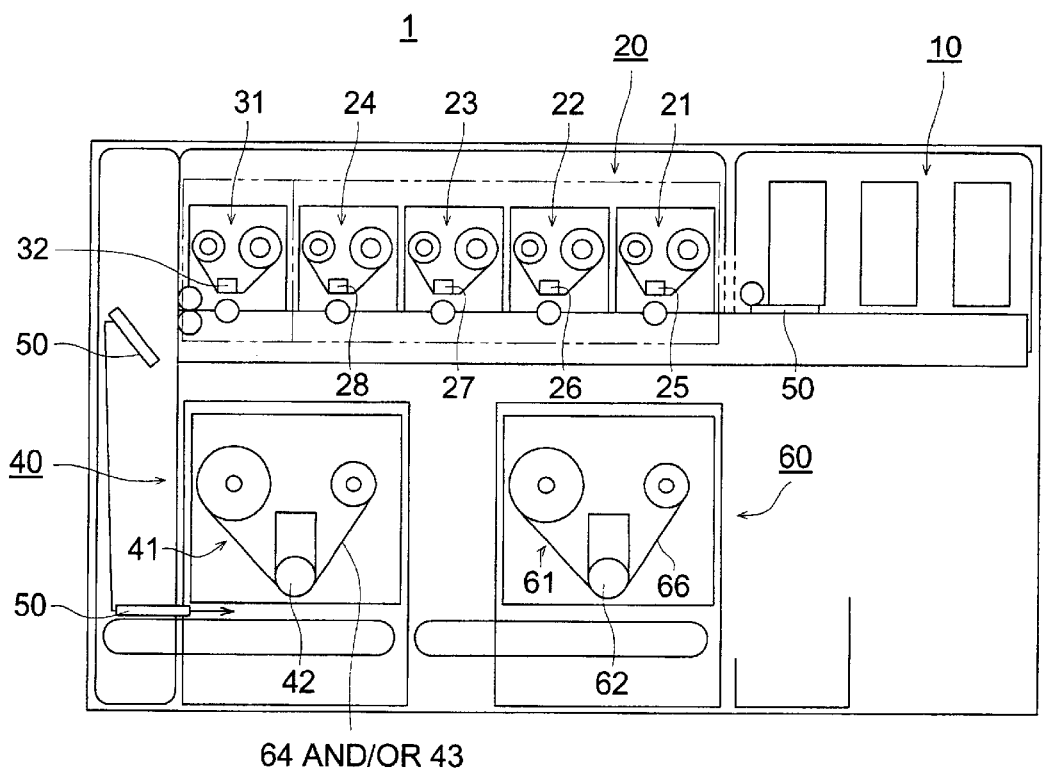
FIG. 5 is a schematic structural view showing an image recording material preparation apparatus of the third embodiment.
Figure 6:
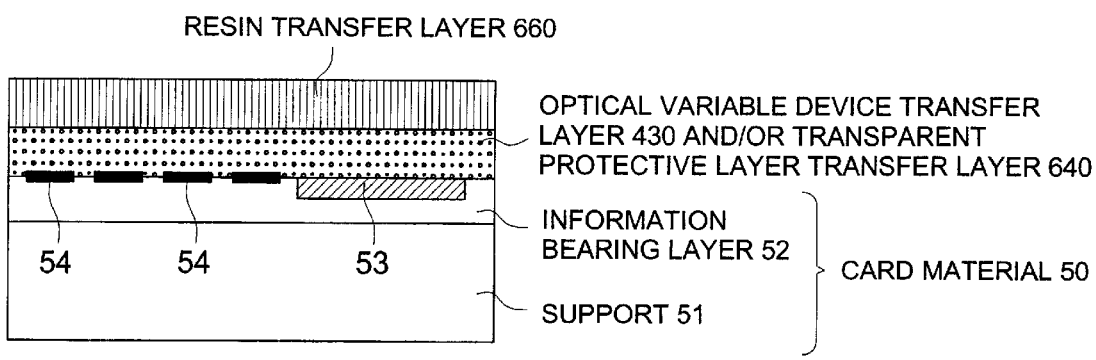
FIG. 6 is a view showing a layer configuration of an image recording material.

Next, FIGS. 5 and 6 show the image recording material preparation apparatus of the third embodiment. FIG. 5 is a schematic structural view of said image recording material preparation apparatus, and FIG. 6 shows the layer structure of an image recording material.

In image recording material preparation apparatus 1 of this embodiment, card supplying section 10 as well as image recording section 20 is constituted in the same manner. However, protection providing section and/or optical variable device providing section 40 and resin providing section 60 is arranged following information recording section 20.

In protection providing section and/or optical variable device providing section 40, transparent protective transfer layer 640 and/or optical variable device transfer layer 430 are/is provided. In resin providing section 60, resin transfer foil 66 is thermally transferred onto an image recording material comprised of transparent protective transfer layer 640 and/or optical variable device layer 430 on information bearing layer 52. Thus resin transfer layer containing hardenable protective layer 660 is provided.

Figure 7:
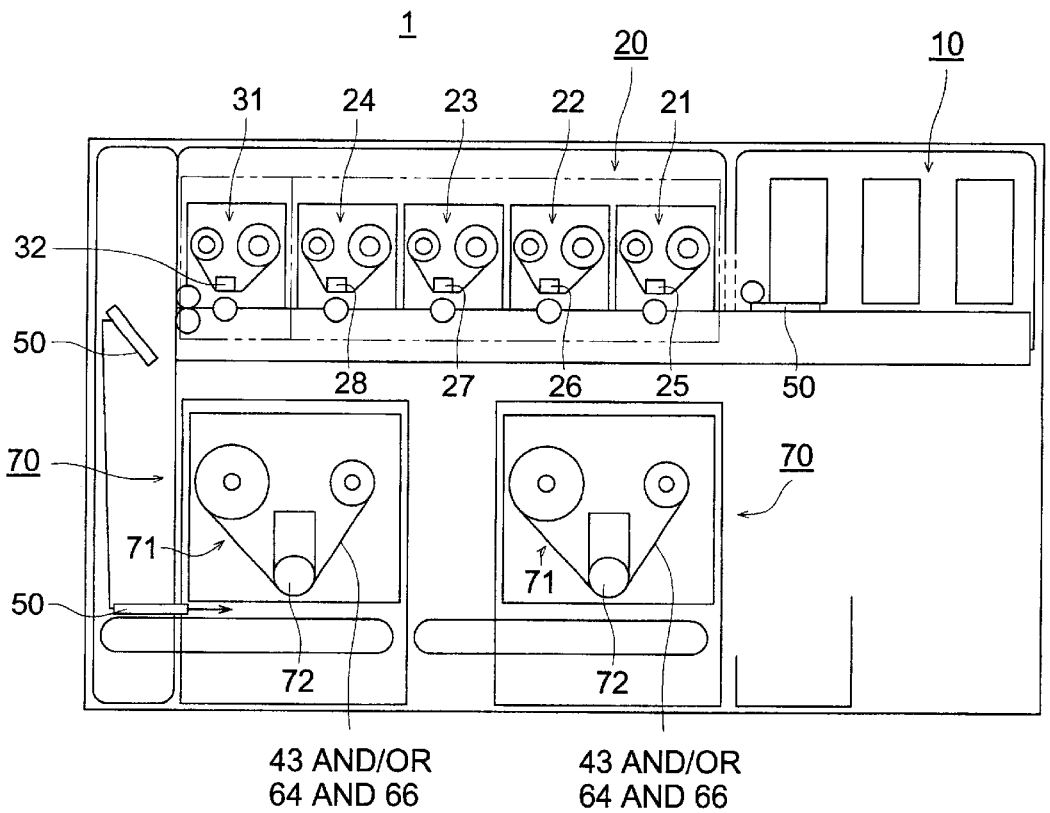
FIG. 7 is a schematic structural view showing an image recording material preparation apparatus of the fourth embodiment.
Figure 8:
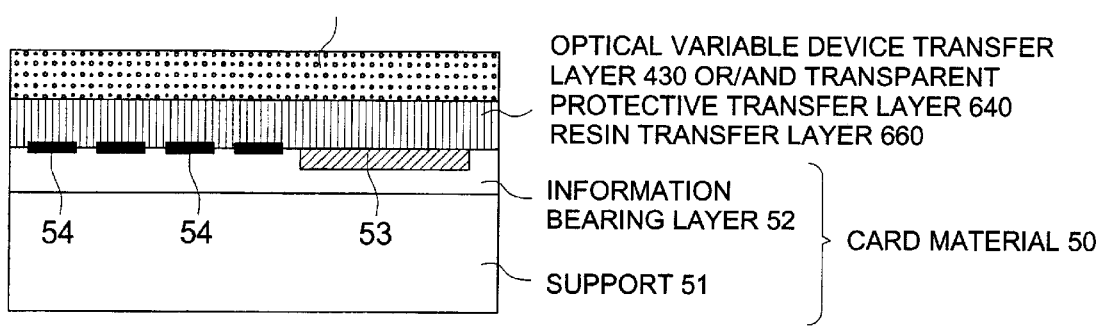
FIG. 8 is a view showing a layer configuration of an image recording material.

Next, FIGS. 7 and 8 show the image recording material preparation apparatus of the fourth embodiment. FIG. 7 is a schematic structural view of said image recording material preparation apparatus, and FIG. 8 shows the layer structure of an image recording material.

In image recording material preparation apparatus 1 of this embodiment, card supplying section 10 as well as image recording section 20 is constituted in the same manner. However, transparent protective layer and/or optical variable device transfer layer providing section/or resin layer providing section 70 is arranged, and thereafter other transparent protective layer and/or optical variable device transfer layer providing section/or resin layer providing section. 70 is also arranged.

In transparent protective layer and/or optical variable device transfer layer providing section/or resin layer providing section 70, transfer foil cassette 71 is arranged, and thermal transfer head 72 corresponding to said transfer foil cassette 71 is arranged. Optical variable device transfer foil 43 and/or transparent protective transfer foil 64 and resin transfer foil 66 are transferred, and optical variable device transfer layer 430 and/transparent protective transfer layer 640 and resin transfer layer 660 are provided.

Figure 9:
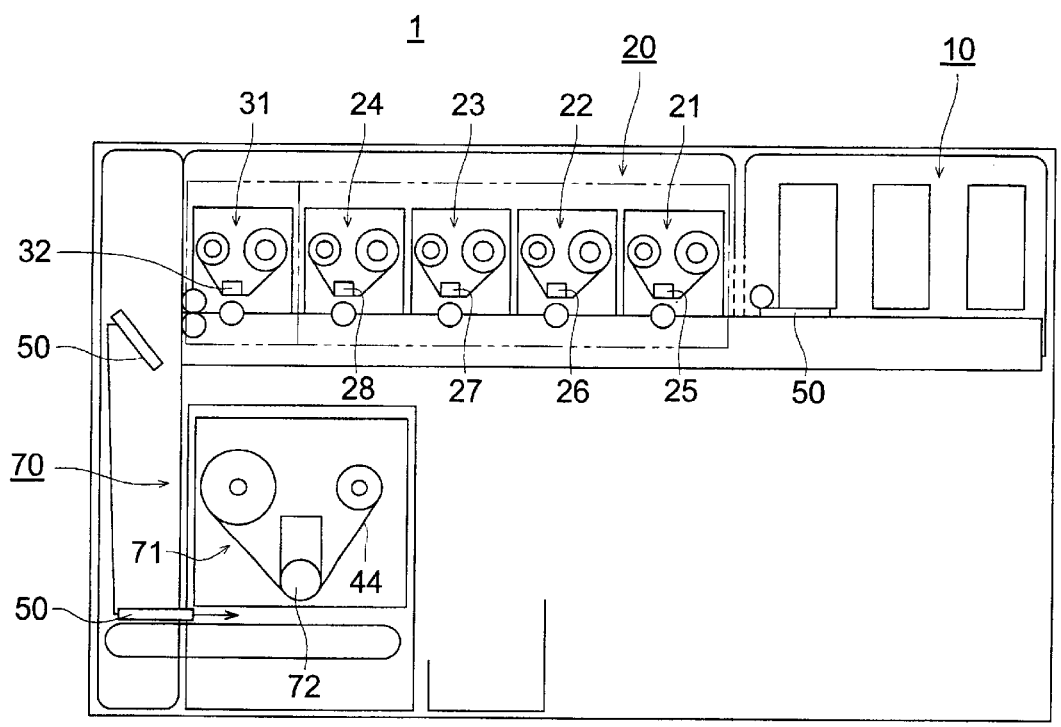
FIG. 9 is a schematic structural view showing an image recording material preparation apparatus of the fifth embodiment.
Figure 10:
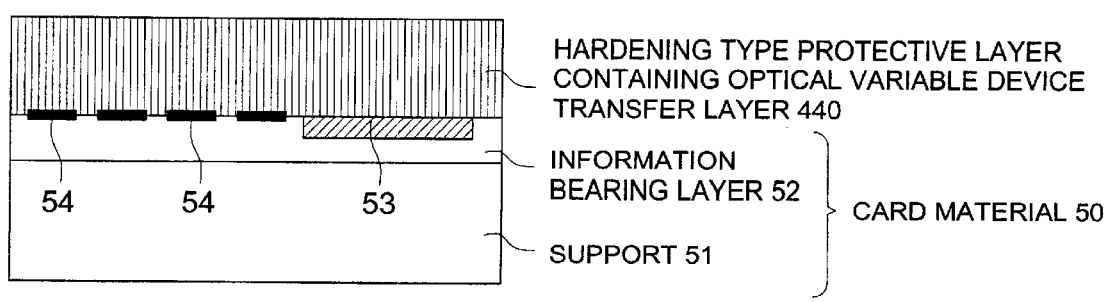
FIG. 10 is a view showing a layer configuration of an image recording material.

Next, FIGS. 9 and 10 show the image recording material preparation apparatus of the fourth embodiment. FIG. 9 is a schematic structural view of said image recording material preparation apparatus, and FIG. 10 shows the layer structure of an image recording material.

In image recording material preparation apparatus 1 of this embodiment, card supplying section 10 as well as image recording section 20 is constituted in the same manner. However, transparent protective layer and/or optical variable device transfer layer providing section/or resin layer providing section 70 is arranged.

In transparent protective layer and/or optical variable device transfer providing section/or resin layer section 70, transfer cassette 71 is also arranged, and thermal transfer head 72 corresponding to said transfer foil cassette 71 is arranged. Hardenable type resin-containing optical variable device transfer foil 44 is transferred and hardenable type resin-containing optical variable device transfer layer 440 is provided. The hardenable type resin-containing optical variable device transfer layer 440 is a layer which comprises a releasing layer, hardenable layer, optical variable device layer, adhesive layer etc., and is transferred from transfer foil to image recording material.

The transparent protective transfer foil, as described in the present invention, means a transparent protective foil which protects an image, and the transparent protective layer, as described herein, means a layer comprised of a resin in which the breaking elongation as well as the friction coefficient of the present invention is specified. Further, the actinic light-hardened resin layer as described herein is one of several types of resin layers, which is the preferred embodiment in the present invention. However, as shown in FIGS. 1 and 2, occasionally, it is limited to a resin layer due to its production. The hardenable type resin-containing optical variable device layer, as described herein, means a layer in which a hardenable layer and an optical variable device layer are integrated. Further, the protection providing transfer foil, as described herein, means a transfer foil comprising at least one resin layer (preferably, comprised of an actinic light-hardened resin).

The transfer foil employed in the invention includes, for example, transparent protective transfer foil, optical variable device foil, hardenable type transfer layer, hardenable resin layer containing optical variable device transfer layer. Next, FIG. 11 shows the embodiment of transparent protective transfer foil 64. Transparent protective transfer foil 64 in FIG. 11(*a*) is comprised of transparent protective transfer layer 640 and-support 64*b,* and transparent protective transfer layer 640 is comprised of transparent protective layer 64*a*2 and adhesive layer 64*a*3. Releasing layer 64*a*1 and adhesive layer 64*a*3 are provided on either sides of transparent protective layer 64*a*2, and releasing layer 64*a*1 is adhered onto support 64*b*. Transparent protective transfer foil 64 in FIG. 11(*b*) is constituted in the same manner as the transfer foil of FIG. 11(*a*). However, interlayer 64*a*4 is provided between transparent protective layer 64*a*2 and adhesive layer 64*a*3. Transparent protective transfer foil 64 is constituted in the same manner as the transfer foil in FIG. 11(*b*). However, two transparent protective layers 64*a*2 are provided. Transparent protective transfer foil 64 in FIG. 21(*d*) is constituted in the same manner as transfer foil of FIG. 11(*b*). However, barrier layer. 64*a*5 is provided between transparent protective layer 64*a*2 and interlayer 64*a*4. Further, said transparent protective layer may be either actinic light-hardened resin layer or a resin layer.

In said transparent protective transfer foil 64, transparent protective transfer layer 640 is peeled from support 64 b and transferred.

FIG. 12 shows the embodiment of optical variable device transfer foil 43. Optical variable device transfer foil 43 in FIG. 12(*a*) is comprised of optical variable device transfer layer 430 and support 43*b,* and optical variable device transfer layer 430 is comprised of releasing layer 43*a*1, optical variable device layer 43*a*2, and adhesive layer 43*a*3. Releasing layer 43*a*1 and adhesive layer 43*a*3 are provided on either sides of optical variable device layer 43*a*2, and releasing layer 43*a*1 is adhered to support 43*b*. Optical variable device transfer foil 43 in FIG. 12(*b*) is constituted in the same manner as transfer foil in FIG. 12(*a*). However, interlayer 43*a*4 is provided between adhesive layer 43*a*3 and optical variable device layer 43*a*2. Optical variable device transfer foil 43 in FIG. 12(*c*) is constituted in the same manner as transfer foil in FIG. 12(*b*). However, barrier layer 43*a*5 is provided between optical variable device layer 43*a*2 and interlayer 43*a*4. The transfer foil in FIG. 12(*d*) is constituted in the same manner as transfer foil in FIG. 12(*c*). However, transparent protective layer 43*a*6 is provided between releasing layer 43*a*1 and optical variable device layer 43*a*2. Further, said transparent protective layer may be either actinic light-hardened resin layer or a resin layer.

In said optical variable device transfer foil 43, optical variable device transfer layer 430 is peeled from support 43*b* and transferred.

Figure 13:
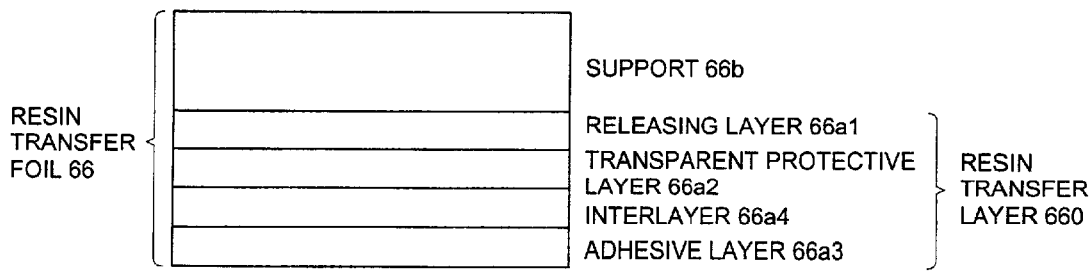
FIG. 13 is a view showing an embodiment of a resin transfer foil.
Figure 13:
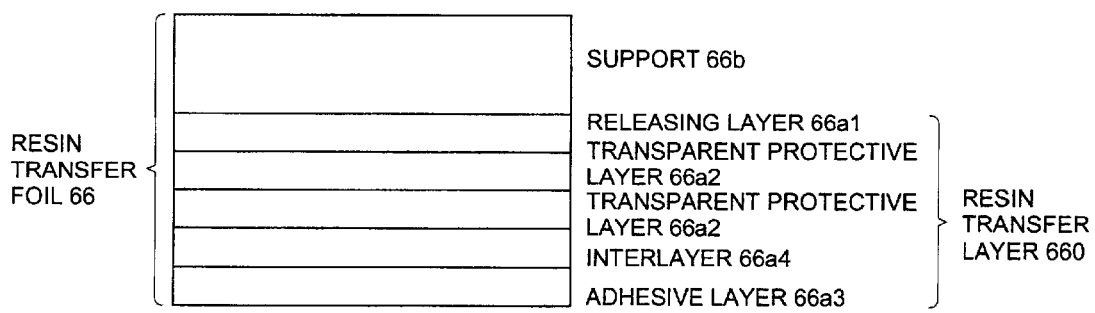
Figure 13:
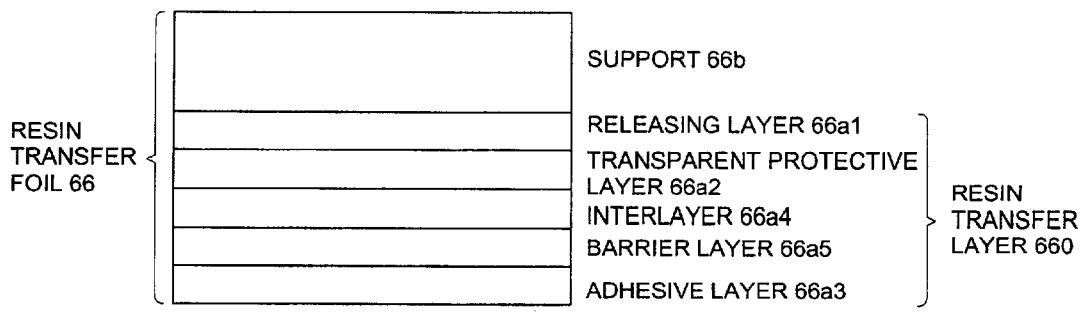

Next, FIG. 13 shows the embodiment of resin transfer foil 66. Resin transfer foil 66 in FIG. 13(*a*) is comprised of resin transfer layer 660 and support 66 b, and resin layer 660 is comprised of releasing layer 66*a*1, transparent protective layer 66*a*2, and adhesive layer 66*a*3. Releasing layer 66*a*1 and adhesive layer 66*a*3 are provided on either sides of transparent protective layer 66*a*2, and releasing layer 66*a*1 is adhered onto support 66*b*. Resin transfer foil 66 in FIG. 13(*b*) is constituted in the same manner as transfer foil in FIG. 23(*a*). However, interlayer 66*a*4 is provided between transparent protective layer 66*a*2 and adhesive layer 66*a*3. Resin transfer foil 66 in FIG. 13(*c*) is constituted in the same manner as transfer foil in FIG. 13(*b*). However, two transparent protective layers 66*a*2 are provided. Resin transfer foil 66 in FIG. 13(*d*) is constituted in the same manner as transfer foil in FIG. 13(*b*). However, barrier layer 66*a*5 is provided between transparent protective layer 63*a*2 and interlayer layer 63*a*4.

In said resin transfer foil 66, resin transfer layer 660 is peeled from support 66*b* and transferred.

Figure 14:
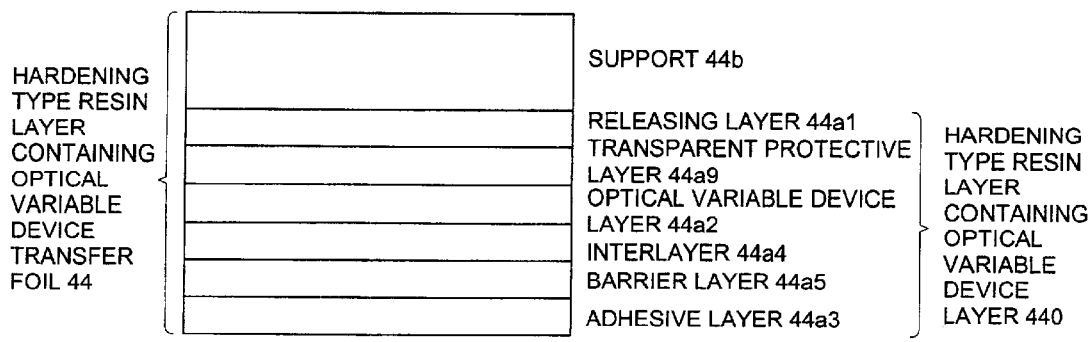
FIG. 14 is a view showing an embodiment of a resin transfer foil.
Figure 14:
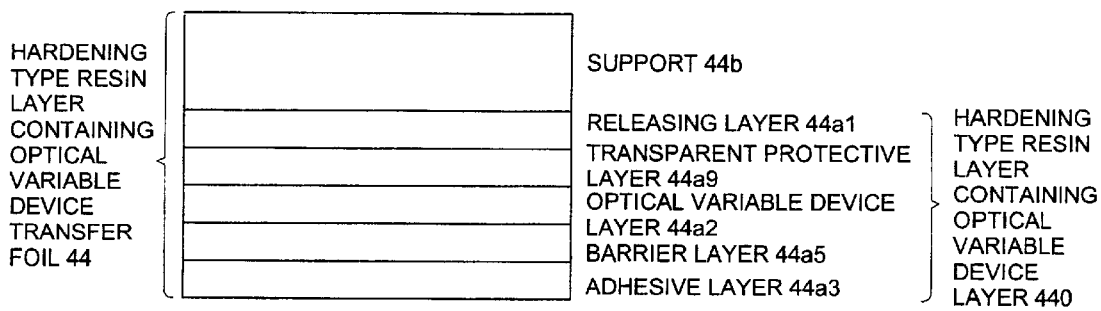
Figure 14:
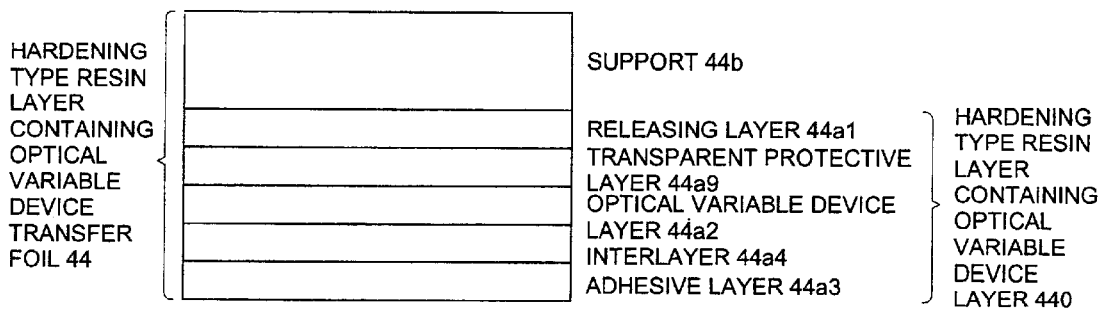

Next, FIG. 14 shows the embodiment of hardenable type resin layer-containing optical variable device transfer foil 44. Hardenable type resin layer-containing optical variable device transfer foil 44 in FIG. 14(*a*) is comprised of hardenable type resin layer-containing optical variable device transfer layer 440, and support 44*b,* and hardenable type resin layer-containing optical variable device transfer layer 44 is comprised of releasing layer 44*a*1, optical variable device layer 44*a*2, and adhesive layer 44*a*3. Releasing layer 44*a*1 and adhesive layer 44*a*3 are provided on either sides of optical variable device layer 44*a*2, and releasing layer 44*a*1 is adhered to support 44*b*. Hardenable type resin-containing optical variable device transfer foil 44 in FIG. 14(*b*) is constituted in the same manner as transfer foil in FIG. 14(*a*). However, resin layer 44*a*9 is provided between releasing layer 44*a*1 and optical variable device layer 44*a*2. Hardenable type resin-containing optical variable device transfer foil 44 in FIG. 14(*c*) is constituted in the same manner as transfer foil in FIG. 14(*b*). However, interlayer 44*a*4 is provided between optical variable device layer 44*a*2 and adhesive layer 44*a*3. Hardenable type resin layer-containing optical variable device transfer foil 44 in FIG. 14(*d*) is constituted in the same manner as transfer foil in FIG. 14(*c*). However, barrier layer 44*a*5 is provided between interlayer 44*a*4 and optical variable device layer 44*a*2. Transfer foil in FIG. 14(*e*) is constituted in the same manner as transfer foil in FIG. 14(*d*). Adhesive layer 44*a*8 is provided between resin layer 44*a*9 and optical variable device layer 44*a*2, and barrier layer 44*a*5 is deleted.

In these hardenable type resin layer-containing optical variable device transfer foils 44, hardenable type resin layer-containing optical variable device transfer layer 440 is peeled from support 44*b* and transferred.

In the transparent protective transfer foil 44 in this embodiment, the transparent protective transfer layer 440 is peeled from the support 44*b* and transferred. Said transparent protective transfer foil is constituted in such a manner that at least releasing layer, a hardenable layer, an optically variable device layer, an inter layer and an adhesive layer are coated onto a support in said order. Said transparent protective transfer foil is excellent in surface protective properties as well as surface abrasion resistance.

Still further, in order to obtain more excellent surface protective properties as well as surface abrasion resistance, the transparent protective layer, which is positioned closer to the surface side of the image recording material than the optical variable device layer, is preferably an ultraviolet radiation-hardenable layer or an electron ray hardenable layer.

Still further, in order to realize the prevention effects for forgery, the optical variable device layer is preferably a hard coat layer or an evaporated layer having a image on an uneven surface.

Further, in order to obtain excellent surface abrasion resistance, at least one transparent protective layer is thermally transferred onto the entire surface of cards.

Still further, antistatic agents are preferably incorporated into either the transparent protective transfer foil or the optical variable device transfer foil. Thus, it is possible to prepare cards or sheets which are resistant to dust adhesion.

Further, the surface formed by the transfer of a layer is preferably subjected to adhesion treatment so that the transfer foil subsequently transferred is readily adhered.

In the transfer foil of the present invention, at least one antistatic layer is preferably provided in a releasing layer, a transparent protective layer, an optical variable device layer, a barrier layer, an interlayer, and an adhesive layer. The antistatic layer in the transfer foil comprises anionic high molecular compounds and/or electrically conductive particles, which exhibit excellent antistatic properties.

Listed as the aforementioned anionic high molecular compounds are polymers comprising a carboxyl group, a sulfonic acid group, and a hydroxyl group, for example, polyacrylic acid, polymethacrylic acid, vinyl chloride, maleic acid mono(2-ethylhexyl) copolymer, polystyrene sulfonic acid, polyvinyl alcohol, cellulose, hydroxyethyl cellulose, and modified compounds thereof. Also listed are those in which the part of the functional group or the entire functional group corresponding to each is modified to alkali metal salts, alkali earth metal salts, transition metal salts, and the like. Of these, preferred are alkali or alkali earth metal salts of polyacrylic acid, polymethacrylic acid, and polystyrene sulfonic acid, and specifically, sodium salts of polystyrene sulfonic acid are preferred from the viewpoint of compatibility with other resins, antistatic properties, and solubility, and viscosity of their solution.

Further, listed as electrically conductive particles are various metals, oxides such as $ZnO$, $TiO_2$, $SnO_2$, $Al_2O_3$, $In_2O_3$, $MgO$, $CoO$, $CuO$, $Cu_2O$, $SrO$, $BaO$, $BaO_2$, $PbO$, $PbO_2$, $MnO_3$, $SiO_2$, $ZrO_2$, $Ag_2O$, $Y_2O_3$, $BiO_3$, $La_2O_3$, $Ti_2O_3$, $Sd_2O_3$, $Sb_2O_5$, $K_2Ti_6O_{13}$, $NaCaP_2O_{18}$, $MgB_2O_5$, and the like, sulfides such as $CuS$, $ZnS$, and the like, carbides such as $SiC$, $TiC$, $ZrC$, $VC$, $NbC$, $WoC$, and the like, nitrides such as $Si_3N_4$, $TiN$, $ZrN$, $VN$, $NbN$, $TaN$, $Cr_2N$, and the like, borides such as $TiB_2$, $ZrB_2$, $NbB_2$, $TaB_2$, $CrB$, $MoB$, $WB$, $LaB_6$, and the like, silicides such as $TiSi_2$, $ZrSi_2$, $NSi_2$, $TaSi_2$, $CrSi_2$, $MoSi_2$, $WSi_2$, and the like, metal salts such as $BaCO_3$, $CaCO_3$, $SrCO_3$, $BaSO_4$, $CaSO_4$, and the like, composites such as $Si_3N_4$-$SiC$, $9Ai_2O_3$-$2B_2O_3$, and the like, materials doped with those, and the like. Of these, preferred are $ZnO$, $TiO_2$, $SnO_2$, $ZrO_2$, $Y_2O_3$, $Sb_2O_5$, $CuS$, $ZnS$, $TiC$, $WC$, $TiN$, $TiB_2$, $ZrB_2$, $MoSi_2$, $WSi_2$, $CaCO_3$, $BaSO_4$, and the like. These compounds may be employed individually or in combination of two types or more.

In the present invention, electrically conductive particles are preferably mixtures consisting of at least two types of particles having different particle shapes. Entire electrically conductive particles are preferably comprised of some of particles having an average particle diameter of 0.01 to 0.5 $\mu$m and the remaining particles having an average particle diameter of 0.5 to 3 $\mu$m, and the preferred ratio is such that the former is 50 to 95 percent by weight and the latter is 5 to 50 percent by weight. When an antistatic layer is formed employing only particles having an average particle diameter of 0.01 to 0.5 $\mu$m, the resulting layer is effective for minimizing static charge as well as transparent spots. However, the following problems occasionally occur: a plurality of sheets are fed, stable running is not carried out, and adhesion to the sticky surface of an image layer immediately after preparing an image recording material is not minimized. Further, when said antistatic layer is formed employing only particles having a particle diameter of 0.5 to 3 $\mu$m, the following effects were obtained: static charge was minimized, the supply of a plurality of sheets was minimized, stable running was carried out, and adhesion to the sticky surface of an image layer immediately after preparing an image recording material was minimized. However, transparent spots were occasionally formed.

As described above, when two types of electrically conductive particles are employed in said antistatic layer, they are effective not only for minimizing static charge but also for minimizing the feeding of a plurality of sheets, stabilizing running, minimizing transparent spots, and minimizing adhesion to the sticky surface of an image layer immediately after preparing a image recording material.

Further, the content of the aforementioned anionic high polymer compounds and/or electrically conductive particles in antistatic layer forming compositions is preferably between 5 and 80 percent by weight with respect to the entire amount, and is more preferably between 10 and 60 percent by weight.

In the present invention, an antistatic layer is formed by blending said anionic high polymer compounds and/or electrically conductive particles with a resin, or by dispersing them into a resin.

Resins forming said antistatic layer are not particularly limited, and various types of resins such as binder resins, known in the art may be employed.

Layer hardened by actinic ray of the invention is composed of materials capable of addition polymerization or open chain polymerization. The addition polymerization compound includes a radical polymerizable compound such as photohardenable material employing photo(or thermo) polymerizable compounds described in, for example, Japanese Patent Open to Public Publication No. 7-159983, Japanese Patent Publication No. 7-31399, Japanese Patent Open to Public Publication Nos. 8-224982, and 10-863, Japanese Patent Application No. 7-231444 and Japanese Patent Application No. 7-231444. The photohardenable material of cationic polymerization is known as the addition polymerization compound, and a photohardenable material of photo-cation polymerization sensitized in the longer range than visible ray recently published, for example, in Japanese Patent Open to Public Publication Nos. 6-43633. Both may be employed in the invention. One or more layers hardened by actinic ray are provided in the layer arrangement, and at least one of the layer satisfies the breaking elongation of 5 to 90%.

A radical polymerization initiator is given for another compound generating radical or acid which may be employed with radical polymerizable composition containing specified compound in the invention. The specific compound in the innovation generates radical such as Cl by light or heat, and the radical withdraws proton in the layer to generate acid such as HCl whereby polymerization is conducted. At this stage, the polymerization initiator mentioned below, which may be employed in combination, generates radical or acid whereby the polymerization is conducted.

The radical polymerization initiator includes triazine derivatives as described in Japanese Patent Publication Nos. 59-1281 and 61-9621, and Japanese Patent O.P.I. Publication No. 60-60104; organic peroxides as described in Japanese Patent O.P.I. Publication Nos. 59-1504 and 61-243807; diazonium compounds as described in Japanese Patent Publication Nos. 43-23684, 44-6413, and 47-1604, and U.S. Pat. No. 3,567,453; organic azides as described in U.S. Pat. Nos. 2,848,328, 2,852,379, and 2,940,853; o-quinonediazides as described in Japanese Patent Publication Nos. 36-22062, 37-13109, 38-18015 and 45-9610; onium compounds as described in Japanese Patent Publication No. 55-39162, Japanese Patent O.P.I. Publication No. 59-14023, and "Macromolecules", Vol. 10, 1307 (1977); azo compounds as described in Japanese Patent Publication No. 59-142205; metal arene complexes as described in Japanese Patent O.P.I. Publication No. 1-54440, European Patent Nos. 109,851 and 126,712, and "Journal of Imaging Science", Vol. 30, 174 (1986); (oxo)sulfonium organic boron complexes as described in Japanese Patent O.P.I. Publication Nos. 5-213861 and 5-255347; titanocenes as described in Japanese Patent O.P.I. Publication No. 61-151195; transition metal complexes containing a transition metal such as ruthenium as described in Japanese Patent O.P.I. Publication No. 2-182701 and "Coordination Chemistry Review", Vol. 84, 85–277 (1988); 2,4,5-triaryl imidazoles as described in Japanese Patent O.P.I. Publication No. 3-209477; carbon tetrabromide; and organic halogenated compounds as described in Japanese Patent O.P.I. Publication No. 59-107344.

The radical polymerization initiator is used in an amount of preferably 0.01 to 10 weight parts based on 100 weight parts of the radical polymerizable compound used.

The imaging layer containing the radical polymerizable compound can contain a thermal polymerization initiator, which is generally used in a conventional polymerization process, in order to initiate thermal polymerization of the radical polymerizable compound. The thermal polymerization initiator herein referred to is a compound capable of generating a radical when heat is applied.

The thermal polymerization initiator includes azobisnitriles such as 2,2'-azobisisobutyronitrile or 2,2'-azobispropionitrile; organic peroxides such as benzoyl peroxide, lauroyl peroxide, acetyl peroxide, t-butyl perbenzoate, ?-cumylhydro peroxide, di-t-butyl peroxide, diisopropylperoxy dicarbonate, t-butylperoxyisopropyl carbonate, peracids, alkyl peroxycarbamates, and nitrosoarylacyl amines; inorganic peroxides such as potassium persulfate, ammonium persulfate, and potassium perchlorate; azo or diazo compounds such as diazoamino benzene, p-nitrobenzene diazonium compounds, azobisalkyls, diazothioethers; arylazosulfones; nitrosophenyl urea; tetramethylthiuram disulfide; diaryl disulfides; dibenzoyl disulfide; tetraalkyl thiuram disulfides; dialkylxanthic acid disulfides; aryl sulfinic acids; arylalkyl sulfonic acids; and 1-alkane sulfinic acids. Of these, the especially preferable is an initiator, which has excellent stability at ordinary temperature and high decomposition speed on heating, and when decomposed, turns colorless, including benzoyl peroxide and 2,2'-azobisisobutyronitrile.

These initiators can be used singly or in combination of two or more kinds. The initiator content of the imaging layer is preferably 0.5 to 10 weight %, and more preferably 1 to 5 weight %.

Example of an epoxy type UV ray hardenable prepolymer or monomer polymerized by cation polymerization includes prepolymer containing two or more epoxy groups in a molecule. Examples of the prepolymer are alicyclic epoxides, polyglycidyl ethers of polyalcohol, polyglycidyl ethers of aromatic polyols, hydrogen adduct compounds of polyglycidyl ethers of aromatic polyols, urethanpolyepoxy compounds and epoxy modified polybutadiens. These prepolymers may be employed solely or by mixing two or more compounds in combination.

Content of the prepolymer containing two or more epoxy group in the coating composition for forming UV ray hardening protective layer is preferably 70 weight % or more. Cationic polymerizable compound comprised of cationic polymerizable composition includes (1)styrene derivative, (2) vinylnaphthalene derivative, (3) vinylether and (4) N-vinyl compound.

Radically polymerizable series is preferable in the invention.

The hardenable layer contains unit represented by formula (1). The vinyl polymer having carboxylic acid of the formula (referred as vinyl polymer of the invention) is described.

In formula (1) $R_1$ and $R_2$ each represents a hydrogen atom or a methyl group, Alkyl group represented by $R_3$ is preferably an alkyl group having carbon toms less than 7 such as methyl group, ethyl group, etc., an aryl group represented by $R_3$ is preferably an aryl group having carbon atoms less than 10 such as phenyl group, naphthyl group, etc.

As a divalent bonding group represented by L, —$CH_2$—CH(OH)—$CH_2$—O—, —$OCH_2$CH (OH)$CH_2$OCO—, —$OC_2CH_2$OCONH—$R_4$—NHCOOCH$_2$— ($R_4$ is p-phenylene group), —$OCH_2C_2$OCOCH$_2$CH$_2$COOCH$_2$—, —$OCH_2CH_2$OCO—$R_5$—COOCH$_2$— ($R_5$ is o-phenylene group) are cited.

L is preferably —$CH_2$—CH(OH)—$CH_2$—O— in the invention.

The vinyl high molecular polymer employed in the invention preferably contains a unit represented by the above mentioned formula (1) at 0.001 to 5 wt %, more preferably 0.001 to 3 wt %. In case that the content of unit represented by the above mentioned formula (1) is not more than 0.001 wt %, the hardenable layer easily deteriorates in stability against chemicals and scratch strength due to reduction of polymerization degree, and in case that it is more than 5 wt %, in particular, more than 10 wt % there is such practical drawback as low yield because it causes gellation during synthesis.

And content of carboxyl group is preferably 5–200, more preferably 10–150 in terms of acid value (KOH/mg). In case that content of carboxyl group is lower than 5 in terms of acid value, adhesive property of polyvinyl butyral resin or polybutyral thermally hardenable layer to the resin layer deteriorates to induce interlayer peeling in a checker pattern. In case that content of carboxyl group is more than 200 in terms of acid value, stability against chemical and strength against scratches deteriorate.

Though density of crosslinking in hardenable layer is improved, it is problematic because adhesive property to neighboring layer deteriorates in case that composition containing resin having unsaturated double bond is added to UV hardenable layer.

The method can be employed to introduce the carboxy group into the vinyl high molecular polymer of the invention that monomer containing the carboxyl group such as $\alpha,\beta$-unsaturated carboxylic acid, for example, acrylic acid, methacrylic acid, maleic acid, maleic anhydride, itaconic acid, itaconic acid anhydride or these derivatives to as copolymerizable ingredient at the time of synthesizing the polymer preliminarily. In case that the derivatives mentioned above are employed once copolymerizing with anhydride such as maleic acid anhydride, after that the anhydride is subjected to hydrolysis by methanol, ethanol, propanol, butanol etc., to add longer alkyl chain on a part of one side of carboxylic acid. Or, a method is employed to make an active site of high molecular polymer, for example, hydroxyl group, amino group high molecular reacted with dicarboxylic acid or acid anhydride.

The polymer containing the polymer unit represented by the formula (1) mentioned above and $\alpha,\beta$-unsaturated carboxylic acid can be synthesized by synthesizing vinyl polymer containing $\alpha,\beta$-unsaturated carboxylic acid by known method at the first step, then, adding unsaturated ethylene compound containing glycidyl group (epoxy group) at the second step. As the unsaturated ethylene compound containing glycidyl group (epoxy group), it is a compound containing unsaturated ethylene compound containing glycidyl group (epoxy group), such as glycidyl methacrylate and glycidyl acrylate are cited for a representative example.

As monomers composed of the vinyl high molecular weight polymer of the invention other than polymer unit represented by formula (1), monomers of (1) to (17) shown below are cited.

(1) Monomer having aromatic hydroxy group such as o-hydroxystyrene, p-hydroxystyrene, m-hydroxystyrene, o-hydroxyphenyl acrylate, p-hydroxyphenyl acrylate and m-hydroxyphenyl acrylate.

(2) Monomer having aliphatic hydroxy group such as 2-hydroxyethyl acrylate, 2-hydroxyethyl methacrylate, N-methylol acrylamide, N-methylol methacryl amide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl) acrylamide, N-(2 -hydroxyethyl) methacrylamide and hydroxyethyl vinylether.

(3) Monomer having aminosulfonyl group such as m-aminosulfonylphenyl methacrylate, p-aminosulfonylphenyl methacrylate, m-aminosulfonylphenyl acrylate, p-aminosulfonylphenyl acrylate, N-(p-aminosulfonylphenyl) methacrylamide, N-(p-aminosulfonylphenyl)acrylamide.

(4) Monomer having sulfonamide group such as N-(p-toluenesulfonyl)acrylamide, N-(p-toluenesulfonyl) methacrylamide.

(5) $\alpha,\beta$-unsaturated carboxylic acid such as acrylic acid, methacrylic acid, maleic acid, maleic anhydride, itaconic acid, itaconic anhydride.

(6) Alkyl acrylate which may be substituted or non-substituted such as methyl acrylate, ethyl acrylate, propyl acrylate, butyl acrylate, amyl acrylate, hexyl acrylate, heptyl acrylate, octyl acrylate, nonyl acrylate, decyl acrylate, undecyl acrylate, dodecyl acrylate, benzyl acrylate, cyclohexyl acrylate, 2-chloroethyl acrylate, N,N-dimethylaminoethyl acrylate and glycidyl acrylate.

(7) Alkyl methacrylate which may be substituted or non-substituted such as methyl methacrylate, ethyl methacrylate, propyl methacrylate, butyl methacrylate, amyl methacrylate, hexyl methacrylate, heptyl methacrylate, octyl methacrylate, nonyl methacrylate, decyl methacrylate, undecyl methacrylate, dodecyl methacrylate, benzyl methacrylate, cyclohexyl methacrylate, 2-chloroethyl methacrylate, N,N-dimethylaminoethyl methacrylate and glycidyl methacrylate.

(8) Acrylamide or methacryl amide such as acrylamide, methacryl amide, N-ethyl acrylamide, N-hexyl acrylamide, N-cyclohexyl acrylamide, N-phenyl acrylamide, N-nitrophenyl acrylamide, N-ethyl-N-phenyl acrylamide, N-(4-hydroxyphenyl)acrylamide and N-(4-hydroxyphenyl)-methacrylamide.

(9) Monomer containing alkyl fluoride group such as trifluoroethyl acrylate, trifluoroethyl methacrylate, tetrafluoropropyl acrylate, tetrafluoropropyl methacrylate, hexafluoropropyl methacrylate, octafluoropropyl acrylate, octafluoropropyl methacrylate, heptadecafluorodecyl acrylate, heptadecafluorodecyl methacrylate and N-butyl-N-(2-acryloxyethyl)heptadecafluorooctyl sulfonamide.

(10) Vinyl ether such as ethyl vinyl ether, 2-chloroethylvinyl ether, propylvinyl ether, butylvinyl ether, octylvinyl ether and phenylvinyl ether.

(11) Vinyl ester such as vinyl acetate, vinyl chloro acetate, vinyl butylate and vinyl benzoate.

(12) Styrene such as styrene, methylstyrene, chloromethyl styrene.

(13) Vinyl ketone such as methyl vinyl ketone, ethyl vinyl ketone, propyl vinyl ketone and phenyl vinyl ketone.

(14) Olefin such as ethylene, propylene, isobutylene, butadiene and isoprene.

(15) N-vinylpyrrolidone, N-vinyl carbazole, 4-vinylpyridine and so on.

(16) Monomer having cyano group such as acrylonitrile, methacrylonitrile, 2-pentenenitrile, 2-methyl-3-butenenitrile, 2-cyanoethyl acrylate, o-cyano styrene, m-cyano styrene and p-cyano styrene.

(17) Monomer having amino group such as N,N-diethylaminoethyl methacrylate, N,N-dimethylaminoethyl acrylate, N,N-dimethylaminoethyl methacrylate, polybutadieneurethane acrylate, N,N-dimethylaminopropyl acrylamide, N,N-dimethylacrylamide, acryloyl morpholine, N-isopropyl acrylamide and N,N-diethyl acrylamide.

Molecular weight of the high molecular weight vinyl polymer of the invention is preferably 3,000–100,000, and more preferably 10,000–80,000. In case that the molecular weight is less than 3,000, heat resistance, chemical resistance and scratch resistance deteriorate. In case that the molecular weight is more than 100,000, gelling reaction apt to occur during storage and stability of a coating solvent becomes problematic. Amount of addition of the vinyl compound to the hardenable layer is preferably 20 to 80 wt %, and more preferably 20 to 70 wt %, and in particular preferably 20 to 50 wt %.

For example, the followings are nominated for a concrete example of high molecular weight vinyl polymer of the invention.

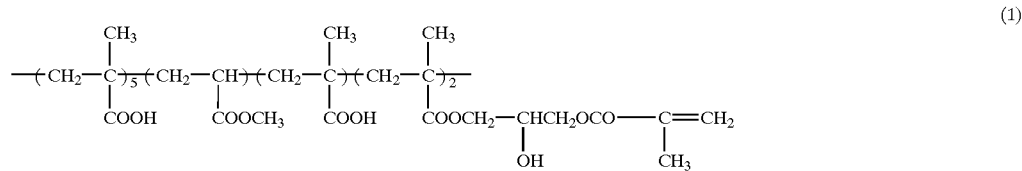 (1)

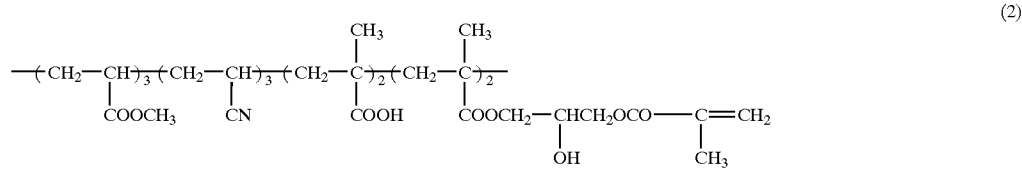 (2)

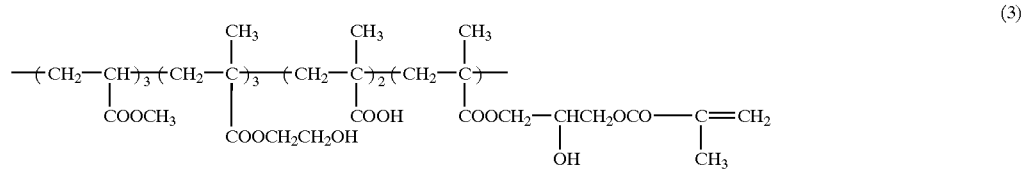 (3)

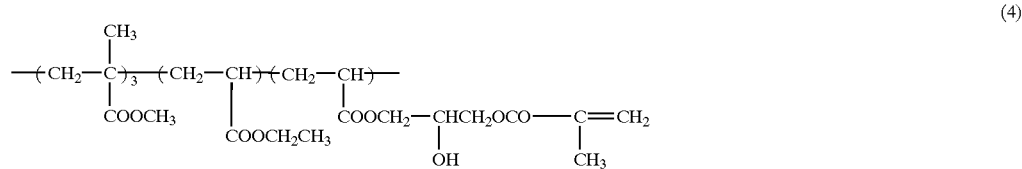 (4)

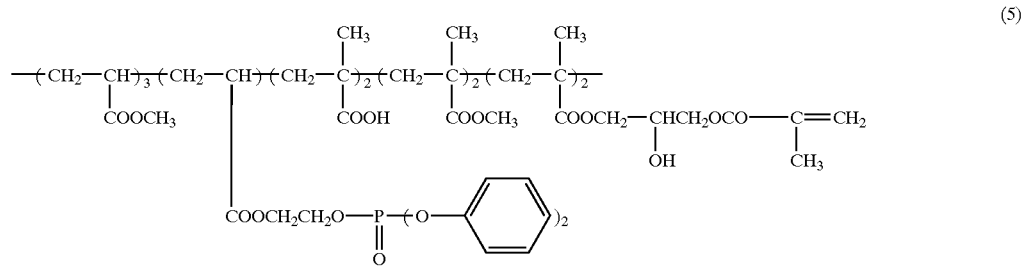 (5)

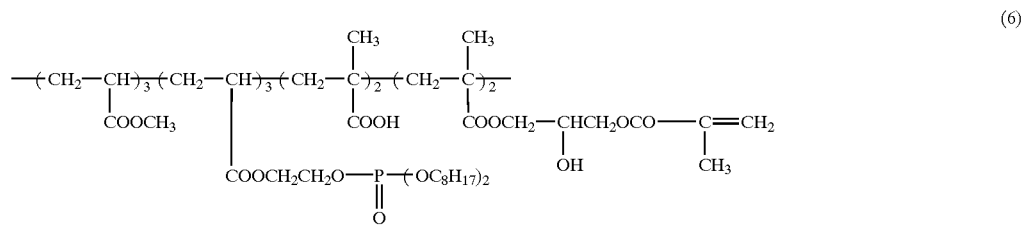 (6)

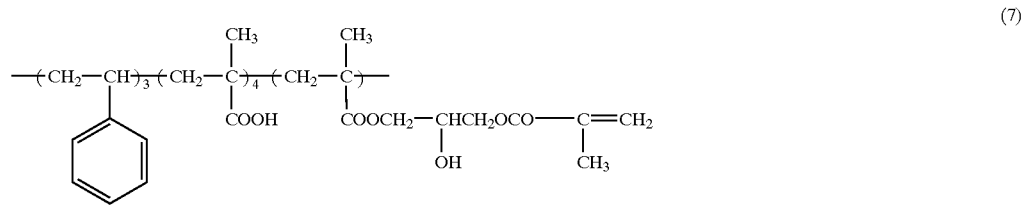 (7)

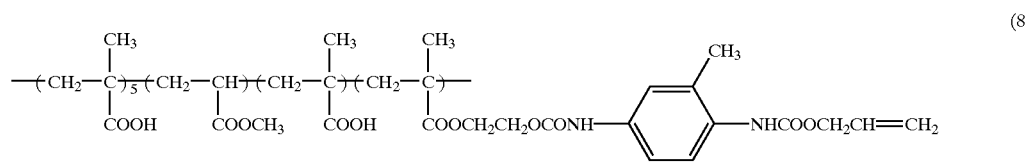 (8)

-continued

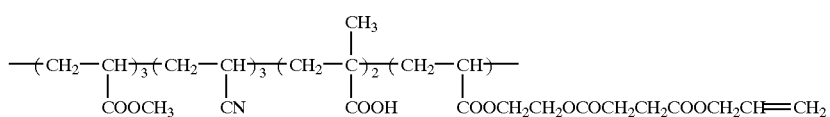

(9)

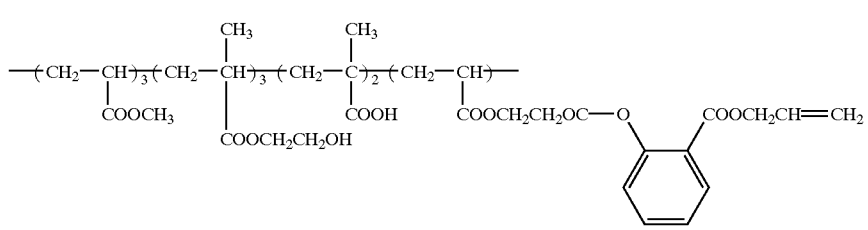

(10)

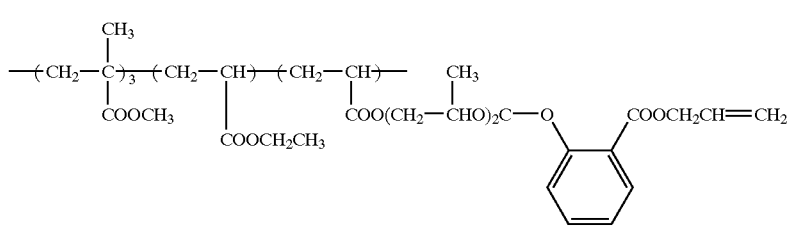

(11)

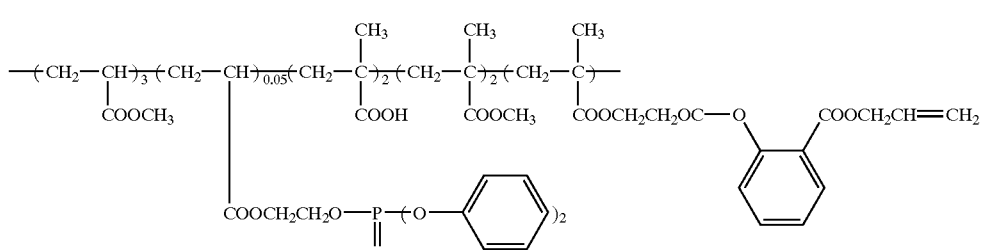

(12)

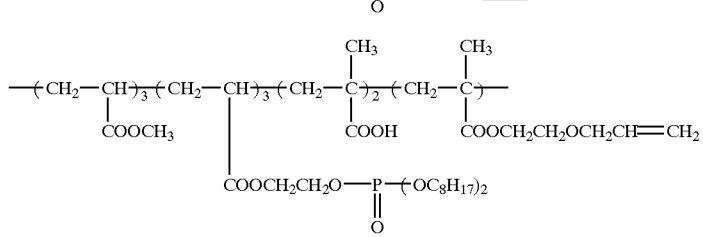

(13)

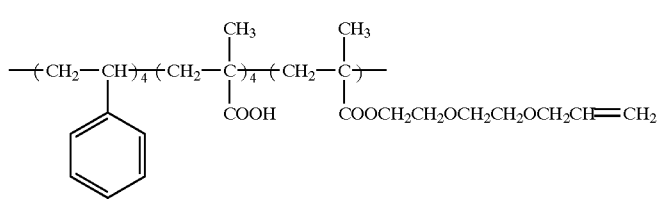

(14)

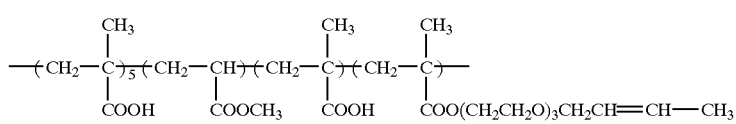

(15)

The monomer or oligomer having at least one polymerizable double bond in a molecule includes any monomer, oligomer or prepolymer having at least one ethylenic unsaturated bond capable of radical polymerization in a molecule. Any kind of these can be employed in the invention. Concrete examples are listed.

Mono functional acrylates such as 2-ethylhexyl acrylate, 2-hydroxypropyl acrylate, glycerol acrylate, tetrahydrofurfuryl acrylate, phenoxy ethylacrylate, nonylphenoxy ethylacrylate, tetrahydrofurfuryloxy ethylacrylate, tetrahydrofurfuryloxyhexanolide acrylate, acrylate of ε-caprolactone adduct of 1,3-dioxane alcohol and 1,3-dioxolane acrylate; and corresponding methacrylate, itaconate, crotonate and maleate, wherein the acrylate of the above mentioned acrylic ester is replaced by these.

Two functional acrylate of diacrylate such as ethylenglycol diacrylate, triethylene glycol diacrylate, pentaerythritol diacrylate, hydroquinone diacrylate, resorcin diacrylate, hexanediol diacrylate, neopentyl glycol diacrylate, tri propylene glycol diacrylate, diacrylate of hydroxy pivalic acid neopentyl glycol, diacrylate of neopentyl glycol adipate, diacrylate of ε-caprolactone adduct of hydroxy pivalic acid neopentyl glycol, 2-(2-hydroxy-1,1-dimethylethyl)-5-hydroxymethyl-5-ethyl-1,3-dioxane diacrylate, tricyclodecane dimethylol acrylate, ε-caprolactone adduct of tricyclodecane dimethylol acrylate, and diglycidyl ether of 1,6-hexanediol; and corresponding methacrylate, itaconate, crotonate and maleate, wherein the acrylate of the above mentioned acrylic ester is replaced by these.

Polyfunctional acrylic acid ester such as trimethylolpropane triacrylate, ditrimethylolpropane tetraacrylate, trimethylolethane triacrylate, pentaerythritol triacrylate, pentaerythritol tetraacrylate, dipentaerythrytol tetraacrylate, dipentaerythrytol pentaacrylate, dipentaerythrytol hexaacrylate, ε-caprolactone adduct of dipentaerythrytol hexaacrylate, pyrogallol triacrylate, propionic acidedipentaerythrytol triacrylate propionic aciddipentaerythrytol tetraacrylate, hydroxypivalyl aldehyde modified di methylol propane triacrylate; and corresponding methacrylate, itaconate, crotonate and maleate, wherein the acrylate of the above mentioned acrylic ester is replaced by these.

Phosphazene monomer, triethylene glycol, isocyanuric acid EO modified diacrylate, isocyanuric acid EO modification triacrylate, di methylol tricyclo decane diacrylate, trimethylolpropane acrylic acid benzoate, alkylene glycol type acrylic acid modification and urethane modification acrylate.

In particular acrylate and methacrylate compounds are employed suitably among these. One or mixture of two kinds or more are employed in combination selecting from these compounds.

In addition thereto, so called prepolymer, which is prepared by that acryl acid or methacrylic acid is introduced to an oligomer having suitable molecular weight and is provided with photopolymerizable property, is also employed suitable for a compound capable of addition polymerization or crosslinking. A kind or mixture of two or more kinds of prepolymers may be employed, or the prepolymer may be employed along with the monomer mentioned above.

Examples of the prepolymer are polyester acrylates which are prepared by introducing (metha)acrylic acid to polyester obtained by bonding polybasic acid such as adipic acid, tri merit acid, maleic acid, phthalic acid, terephthalic acid, himic acid, malonic acid, succinic acid, glutaric acid, itaconic acid, pyromellitic acid, fumaric acid, pimelic acid, sebacic acid, dodecanoic acid and tetrahydro phthalic acid with polyvalent alcohol such as ethylenglycol, propylene glycol, diethylene glycol, propylene oxide, 1,4-butanediol, triethylene glycol, tetraethylene glycol, polyethylene glycol, glycerin, trimethylolpropane, pentaerythritol, sorbitol, 1,6-hexanediol and 1,2,6-hexanetriol;

Epoxy acrylates which is prepared by introducing (meta) acrylic acid into epoxide resin, such as bisphenol A.epichlorohydrin.(meta)acrylic acid, phenol novolak epichlorohydrin.(meta)acrylic acid;

Urethane acrylates which is prepared by introducing (meta)acrylic acid into urethane resin, such as ethylenglycol adipic acid.tolylene diisocyanate.2-hydroxyethyl acrylate, polyethyleneglycol.tolylene diisocyanate.2-hydroxyethyl acrylate, hydroxyethylphthalyl methacrylate.xylene diisocyanate, 1,2-polybutadiene glycol.tolylene diisocyanate.2-hydroxyethyl acrylate, trimethylolpropane-propylene glycol-tolylene diisocyanate.2-hydroxyethyl acrylate;

Silicone resin acrylates such as poly siloxane acrylate, poly siloxane diisocyanate.2-hydroxyethyl acrylate; and Alkyd modified acrylate, which is prepared by introducing (meta)acryloyl group into oil modified alkyd resin and spiran resin acrylate.

The monomer, oligomer or prepolymer containing one or more polymerizable double bond in the molecule is composed with content of preferably 20 to 70 weight, and more preferably 40 to 70 weight.

The breaking elongation of the resin layer or hardenable layer is preferably 5% or more.

The breaking elongation (in percent) in the present invention was measured as follows. A resin layer was left untouched at ambient conditions of 23° C. and 55% RH for at least one hour. Thereafter, the resulting layer was measured employing a Tensiron Multipurpose Tester RTA-100 of Orientech Co., Ltd., while carrying out data processing, employing Tensiron Multifunctional Type Data Process Type MP-100/200S Ver. 44. The resin was fixed employing an air-chuck method. It is possible to select each of ranges as follows: 5 to 100 mm/minute for the cross head speed, 5 to 100 percent for the RANGE, and 0.1 to 500 kg for the load. In the present invention, evaluation was carried out at a cross head speed of 30 mm/minute, a RANGE of 20 percent, and a load of 100 kg.

Further, when the breaking elongation of resins or actinic light-hardened resins is measured, it is difficult to prepare a single resin film comprised of only the actinic light-hardened resin layer. Therefore, a 5 μm thick resin layer is formed on a 12 μm thick PET. The actinic light-hardened resin layer was conveyed two times at a 5 m of CS under a mercury lamp having exposure energy of 160 W/cm and thereby the layer was hardened.

Measurements were carried out in such a manner that a 1 cm wide sample was fixed employing an air chuck and pulling tests were carried out. The breaking elongation was obtained based on the breaking elongation point at which during pulling resins or actinic light-hardened resins, breaking or cracking occurred.

Polyvinyl butyral resins having a degree of polymerization of at least 1,000, in the interlayer of the present invention, are commercially available such as S-lec BH-3, BX-1, BX-2, BX-5, BX-55, and BH-S, manufactured by Sekisui Kagaku Kogyo Co., Ltd., and Denka Butyral #4000-2, S#000-A, #6000-EP, manufactured by Denki Kagaku Kogyo Co., Ltd., and the like. The degree of polymerization before thermohardening of polybutyral thermohardening resins in the interlayer is not particularly limited, and resins may be employed which have a lower degree-of polymerization. Isocyanate hardeners, epoxy hardeners, and the like, may be employed for thermohardening, and thermohardening conditions are preferably between 50 and 90° C. over 1 to 24 hours. The thickness of the interlayer is preferably between 0.1 and 1.0 μm.

The transparent resin layer may be provided by means of off-set printing, screen printing etc., employing ink binder and vanish. Example of the binder and vanish includes rosin modified phenol resin, maleic acid rosin and polymer rosin ester.

Example of transparent resin layer is particularly preferable ink binder and vanish which are hardenable with UV ray, and they are employed in a hardened form by UV ray. Practical examples include polyfunctional oligoacrylate such as radical polymerizable polyolacrylate, polyester acrylate, epoxy acrylate, urethane acrylate, rosin modified epoxyacrylate and rosin modified acrylate.

In the present invention, in terms of slip properties, waxes are preferably incorporated into said resinous layer. The added amount of said waxes is preferably in the range of 0 to 3 percent by weight, and is more preferably in the range of 0 to 2 percent by weight. When the amount of wax is 3 percent by weight or more, during transferring a transfer foil comprised of 1) thermally adhesive resins and 2) a transparent protective layer and/or an optical variable device layer, a problem with tight adhesion occurs due to the degradation of adhesion between layers.

Specifically listed as said waxes may be vegetable waxes such as carnauba wax, candelilla wax, Japanese wax, ourikyuri wax, rice wax, jojoba oil, esparu wax, and the like; animal waxes such as bees wax, insect wax, cerac wax and whale wax, lanolin, and the like; petroleum waxes such as paraffin wax, microcrystalline wax, petrolatum, ester wax, oxidized wax, and the like; mineral waxes such as montan wax, ozokerite and ceresin, and the like; synthetic waxes such as Fischer-Tropsch wax, polyethylene wax, montan wax derivatives, paraffin wax derivatives, microcrystalline wax derivatives, hardened castor oil, hardened castor oil derivatives, and the so-called common waxes. In addition to these waxes, it is possible to use higher fatty acids such as palmitic acid, stearic acid, margaric acid, behenic acid, and the like; higher alcohols such as palmityl alcohol, stearyl alcohol, behenyl alcohol, marganyl alcohol, myricyl alcohol, icosanol, and the like; higher fatty acid esters such as cetyl palmitate, myricyl palmitate, cetyl stearate, myricyl stearate, and the like; amides such as acetamide, propionic acid amide, palmitic acid amide, stearic acid amide, behenic acid amide, amide wax, and the like; and higher amines such as stearylamine, phenylamine, palmitylamine, and the like. Other than these, it is also possible to use low melting point thermoplastic resins such as low molecular weight polyethylene, polypropylene, polystyrene, polyester, polyamide, polycaprolactone, and the like.

In addition to these, for the improvement of printability, employed may be acrylate monomers such as diethylene glycol dimethacrylate, and the like, and further, polymerization initiators and sensitizers such as benzoyl peroxide, benzophenone, and the like in the commonly used amount.

The protective layer comprised of transparent adhesive resins of the present invention can be formed as follows: a transparent protective layer ribbon which is prepared by being applied onto a heat resistant support such as, for example, a polyethylene terephthalate resin film, or a transparent protective foil is previously prepared, and any of these is subjected to thermal transfer employing, for instance, a thermal head or a thermal transfer roll.

Listed as said thermal adhesive resins may be, for example, vinyl chloride based resins, polyester based resins, acryl based resins, polyvinyl acetal based resins, polyvinyl butyral based resins, polyvinyl alcohols, polycarbonates, cellulose based resins, styrene based resins, urethane based resins, amide based resins, urea based resins, epoxy resins, phenoxy resins, polycaprolactone resins, polyacrylonitrile resins, SEBS resins, SEPS resins, and modified products thereof.

Of these resins, those, which are preferable to achieve the objects of the present invention, are vinyl chloride based resins, polyester based resins, acryl based resins, polyvinyl butyral based resins, styrene based resins, epoxy resins, urethane based resins, urethane acrylate resins, SEBS resins, and SEPS resins. These resins may be employed individually or in combination.

Said thermal adhesive resin transparent protective layer may be comprised of at least two layers. Specifically, when the actinic light hardening protective layer described below is formed, at least two layers are preferred. In such a case, selected as thermally adhesive resinous layers, which are brought into contact with said actinic light hardening protective layer, are those which exhibit good adhesion with the actinic light hardening protective layer which is formed on said thermally adhesive resinous layer. However, it is preferred to select from these resins described above.

The optical variable device, as described in the present invention, means (1) a two-dimensional CG image of diffraction grating such as a kinegram, which is characterized in that an image composed of line drawing freely moves, rotates, expands, shrinks and the like; (2) one characterized in that an image such as a pixelgram is converted into a positive as well as a negative; (3) one-such OSD (Optical Security Device) in which the color varies from gold to green; (4) one such LEAD (Long Lasting Economical Anticopy Device) in which an image looks to be variable; (5) a stripe type OVD; (6) a metal foil. Security may be maintained employing sheet materials, special printing techniques, special inks, and the like, described in Nihon Insatsu Gakkai Shi (Journal of Japan Printing Society), Volume 35, No. 6, pages 482 to 496. In the present invention, a hologram is particularly preferred.

Optimally accepted as holograms employed in the present invention may be laser reproduction holograms such as a relief hologram, a Fresnel's hologram, a Fraunhofer hologram, a lensless Fourier-transform hologram, an image hologram, and the like; whiteness reproduction holograms such as a Lippmann hologram, a rainbow hologram, and the like; a color hologram, a computer hologram, a hologram display, a multiflex hologram, a hologram flex stereogram, a holographic diffraction grating, and the like.

The optical variable device layer may be formed, for example, by adhering the hologram sheet onto the image receiving layer. Employed as hologram sheets may be a relief type hologram sheet. Said relief type hologram sheet comprises a support film having thereon a hologram forming layer and a hologram effect layer, in said order. Specifically, the hologram sheet may be prepared as follows. A resin layer which is solid at normal temperature and has thermal shape forming properties, for example, an electron ray-hardening thermoplastic resin layer (a hologram forming layer), which is solid at normal temperature, is formed on a support film such as polyethylene terephthalate film. The resulting surface is pressed with an original plate of a hologram, in which a hologram diffraction pattern is formed with concave and convex areas, and said concave and convex shape is transferred to the resin surface, and the resulting surface is then hardened. Further, formed on the convex and concave surface of a hologram effect layer, which is provided with sufficient transparency as well as large reflectivity at a certain angle and is comprised of material (for example, an evaporated film of $TiO_2$, $SiO_2$, and ZnS) having a different refractive index from those in the hologram forming layer. The hologram reproduces images employing white light such as daylight, illuminating light and the like. Accordingly, in a normal state, a hologram image is observed and thus excellent decorative properties are exhibited. On the other hand, those in which images are reproduced by laser beam are advantageous for detecting alteration.

A bead containing layer may be provided. The beads containing layer synthesizes a part of the incident light to which phase difference is given with the incident light, by which light component of specific wavelength is emphasized by interference and light having different tone from the incident light is returned in a direction of incident light. The beads containing layer comprises a reflective base and well-order arranged transparent beads provided on the base. Example of the beads material is glass. A lot of beads having preferable diameter of 10 to 60 $\mu$m, more preferably 15 to 40 $\mu$m are provided in well-order arrangement. Refractive index of the bead is preferably 1.6 to 2.1, more preferably 1.7 to 2.0. Incident light from outside is enter in the beads and at least part of the light runs from the bead and comes into the beads again after reflected by the reflective support through the resin layer. The reflective light can be returned to incidental direction when the incidental angle varied in certain amount since surface which beads protrude is spherical which make operated in the similar way.

A reflective layer may be provided. The reflective is selected from a metallic film, metal oxide film, light interference substance and diffraction layer. The reflective layer is prepared by, preferably, printing a coating composition containing powder which develop interference color such as interference substance, metal oxide and mica in optional pattern.

Listed as metal oxides are titanium dioxide, iron oxide, low degree titanium oxide, zirconium oxide, silicon dioxide, aluminum oxide, cobalt oxide, nickel oxide, cobalt titanate, and the like, and composite oxides such as $Li_2CoTi_3O_8$, $KNiTiO_x$, and the like or mixtures thereof. However, said metal oxides are not particularly limited to these, as long as they are metal oxides which are capable of generating interference colors. Employed as interference material layers may be metal films which exhibit interference color which are obtained by oxidizing the surface of a metal film. Said metal films are prepared by employing methods in which aluminum, titanium, or stainless steel metal films are subjected to anodic oxidation; metal oxides, which are capable of generating the interference color, are prepared employing a sol-gel method and are coated; metal alkoxides, which are capable of generating interference color, are applied onto a metal film, followed by thermal decomposition; and evaporating methods such as CVD and PVD.

An actinic light hardening type resinous layer is provided in such a manner that transparent protective transfer foil 64 in FIG. 11, optical variable device transfer foil 43 in FIG. 12, hardening type transfer foil 66 in FIG. 13, and hardening type resinous layer containing optical variable device transfer foil 44 in FIG. 14 are employed individually or in combination.

After providing the actinic light hardening resinous layer is provided as described above, exposure is carried out employing actinic light to form a hardened layer, and cards are prepared.

The transfer foil of the present invention comprises a support having thereon a layer which contains inorganic or organic fine particles comprising a heat and/or light cross linking group. In addition, said transfer foil comprises a support preferably having thereon a layer which contains inorganic or organic fine particles with an average particle diameter of 0.01 to 10 μm, comprising a heat and/or light cross linking group.

Said heat and/or light cross linking group has at least a vinyl group, an acryloyl group or a methacryloyl group, a glycidyl group, an isocyanate group, and a carboxyl group, and inorganic or organic fine particles comprising a heat and/or light cross linking group are incorporated into at least a releasing layer and a heat and/or light hardening layer.

Further, the transfer foil of the present invention comprises a transparent protective layer and/or an optical variable device layer transfer layer. Still further, said transfer foil comprises at least one releasing layer and the general formula described below is held.

(General Formula 1)

Average particle diameter of inorganic or organic fine particles in the releasing layer/thickness of the releasing layer×100=1.0 to 400

Optionally employed as fillers of the transfer foil employed in the present invention may be fine organic or inorganic particles which are known in the art, as long as they are not excessively deformed during transfer formation of images.

Specific compounds include, as inorganic compounds, metal oxides such as silica, titanium oxide, aluminum oxide, zinc oxide, magnesium oxide, zirconium oxide, and aluminum borate; metal carbonates such as calcium carbonate, magnesium carbonate, and the like; metal sulfates such as barium sulfate, magnesium sulfate, and the like; metal hydroxides such as aluminum hydroxide, magnesium hydroxide, and the like; metal borides such as titanium boride, zirconium boride, and the like; metal carbides such as titanium carbide, zirconium carbide, niobium carbide, tungsten carbide, and the like; metal nitrides such as titanium nitride, zirconium nitride, tantalum nitride, and the like; metal silicides such as titanium silicide, zirconium silicide, molybdenum silicide,.and the like; others such as kaolin, clay, talc, diatomaceous earth, perlite, bentonite, mica, synthetic mica, and the like.

Listed as organic compounds are particles of melamine resins, guanamine resins, styrene-acryl resins, silicone resins, fluorine resins, polymethyl methacrylate, high molecular weight polyethylene, and the like.

Preferably, the aforementioned heat or light cross linking group containing inorganic or organic fine particles are substantially colorless. Their shape is optional and may be amorphous or crystalline such as spherical, acicular, tabular, or prismatic. However, from the aspect of the uniformity of a filler added layer, the spherical shape is specifically preferred. The preferred particle diameter of fillers varies depending on the thickness of the particle added layer. However, the average particle diameter is commonly in the range of 0.01 to 10 μm (when particles are amorphous, the longest available length of particles is employed), and is preferably between 0.01 and 2 μm. Those, which are specifically preferred in the present invention, are fine filler particles having an average particle diameter of 0.5 μm or less.

The average particle diameter, as described in the present invention, means not always the primary particle diameter of fine particles, and means the average particle diameter of fine particles which are incorporated into the releasing layer. The fine particles in the releasing layer may aggregate to from secondary particles or may be dispersed so as to be incorporated as primary particles. A measurement method is exemplified as follows: the releasing layer is peeled from the transfer foil and the surface of the releasing layer is observed employing an electron microscope. The length in the-long axis direction in the observed state is designated as the particle diameter and the average diameter in an area of 10 $mm^2$ of the observed releasing layer surface is calculated. Said measurement is carried out at randomly selected 10 positions in the same transfer foil. The average particle diameter of each 10-position is obtained and further the average of the resultant averages is obtained. Thus the average particle diameter of the fine particles of the transfer foil is preferably obtained.

Regarding the relationship between the average particle diameter of fillers and the thickness of the layer, the particle diameter of fillers is specifically preferred to be less than the thickness of the layer comprising particles. Methods to incorporate fillers-into the layer include one in which said fillers may be directly dispersed into the other components, or another one in which fillers which have been dispersed in a suitable dispersion medium may be added. In the present invention, a transfer foil comprising inorganic or organic fine particles in the releasing layer is expressed, and the resultant relationship is preferably in average particle diameter/thickness of the releasing layer×100=1.0 to 400. When the ratio is greater than 400, problems occur in which, when transfer is carried out, particles remain on the surface of the transferred base material, and the overall appearance is degraded. When the ratio is less than 1.0, problems also occur in which, when transfer and peeling are carried out, during peeling the transfer foil from the base material, the extraneous transfer parts remain on the base material surface (hereinafter referred to as fin).

In the present invention, the transfer foil comprises a releasing layer containing inorganic or organic fine particles. It has been discovered that, when the relationship of average particle diameter/thickness of the releasing layer×100=1.0 to 400 is held, the number of fins decreases.

It is preferable that when the inorganic or organic fine particles having a heat or light cross linking group, which are employed in the present invention, are on the surface of the releasing layer, said particles combine with the adjacent layer through actinic light to enhance the layer strength, and also improve adhesion. It is also preferable that when said particles resin in the hardening layer, said hardening layer combines with the adjacent layer through actinic light to enhance the layer strength and improve adhesion.

Listed as light cross linking organic fillers are, for example, those which have a photopolymerizable group in an amount of at least 0.1 millimole per g, such as an acryloyl group, a methacryloyl group, an acrylamide group, a maleic acid diester group, an allyl group, a vinyl thioether group, a vinyl amino group, a glycidyl group, an acetylene unsaturated group, and the like, on the surface of melamine resins, guanamine resins, styrene-acryl resins, silicone resins, fluorine resins, polymethyl methacrylate, high molecular weight polyethylene, fluorine resins, urethane resins, and the like, or which have a thiol group (—SH) and a halogen atom in an amount of at least 0.1 millimole per g. Of these, preferred are a vinyl group, an acryloyl group or methacryloyl group, and a glycidyl group.

It is possible to synthesize these fillers employing specific methods described in Japanese Patent Publication Open to Public Inspection Nos. 07-109355, 08-100006, and 09-204043. It is also possible to use a method in which dibylbenzene and the like is employed as a monomer component and further aqueous dispersed fine particle are synthesized. Further, it is possible to synthesize these fillers by applying coupling agents, glycidyl acrylate or glycidyl methacrylate, acrylate or methacrylate containing an NCO group. Still further, it is also possible to employ SX8742 (B)-03, manufactured by Nippon Gosei Gomu Co.

Listed as light cross linking inorganic fillers are, for example, metal oxides such as silica, titanium oxide, aluminum oxide, zinc oxide, magnesium oxide, zirconium oxide, and aluminum borate; metal carbonates such as calcium carbonate, magnesium carbonate, and the like; metal sulfates such as barium sulfate, magnesium sulfate, and the like; metal hydroxides such as aluminum hydroxide, magnesium hydroxide, and the like; metal borides such as titanium boride, zirconium boride, and the like; metal carbides such as titanium carbide, zirconium carbide, niobium carbide, tungsten carbide, and the like; metal nitrides such as titanium nitride, zirconium nitride, tantalum nitride, and the like; metal silicides such as titanium silicide, zirconium silicide, molybdenum silicide, and the like; other compounds such as kaolin, clay, talc, diatomaceous earth, perlite, bentonite, mica, synthetic mica, and the like; those compounds which have a photopolymerizable group in an amount of at least 0.1 millimole per g, such as an acryloyl group, a methacryloyl group, an acrylamide group, a maleic acid diester group, an allyl group, a vinyl thioether group, a vinyl amino group, a glycidyl group, an acetylene unsaturated group, and the like, on the surface of melamine resins, guanamine resins, styrene-acryl resins, silicone resins, fluorine resins, polymethyl methacrylate, high molecular weight polyethylene, fluorine resins, urethane resins, and the like, and those which have a thiol group (—SH) and a halogen atom in an amount of at least 0.1 millimole per g. Of these, preferred are a vinyl group, an acryloyl group or methacryloyl group, and a glycidyl group. It is possible to synthesize these employing specific methods described in Japanese Patent Publication Open to Public Inspection Nos. 07-109355, 08-100006, and 09-204043. Specifically, it is possible to obtain inorganic fillers having a light cross linking group of the present invention, employing reactions of metal hydroxides such as silica having a hydroxide group on the surface of inorganic fillers, aluminum hydroxide, magnesium hydroxide, and the like with silane coupling agents having an unsaturated group such as an acryloyl group, a methacryloyl group, an acrylamide group, maleic acid diester group, an allyl group, a vinyl thioether group, a vinyl amino group, glycidyl group, and the like.

Further, it is preferable that when the fine inorganic or organic fine particle s having a heat cross linking group, which are employed in the present invention, are on the surface of the releasing layer, said particles combine with the adjacent layer through heat to enhance the layer strength and improve adhesion. It is also preferable that when said particles resin remain in the hardening layer, said hardening layer combines with the adjacent layer through heat to enhance the layer strength and improve adhesion.

Listed as light cross linking organic fillers are, for example, are those which have a heat cross linking group in an amount of at least 0.1 millimole per g, such as a COOH group, an isocyanate group, and the like on the surface of melamine resins, guanamine resins, styrene-acryl resins, silicone resins, fluorine resins, polymethyl methacrylate, high molecular weight polyethylene, fluorine resins, and the like. Those preferred are a COOH group and an isocyanate group. It is possible to synthesize said fillers employing methods described in Japanese Patent Publication Open to Public Inspection Nos. 06-194837, 06-230573, and others.

Listed as light cross linking inorganic fillers are, for example, metal oxides such as silica, titanium oxide, aluminum oxide, zinc oxide, magnesium oxide, zirconium oxide, and aluminum borate; metal carbonates such as calcium carbonate, magnesium carbonate, and the like; metal sulfates such as barium sulfate, magnesium sulfate, and the like; metal hydroxides such as aluminum hydroxide, magnesium hydroxide, and the like; metal borides such as titanium boride, zirconium boride, and the like; metal carbides such as titanium carbide, zirconium carbide, niobium carbide, tungsten carbide, and the like; metal nitrides such as titanium nitride, zirconium nitride, tantalum nitride, and the like; metal suicides such as titanium silicide, zirconium silicide, molybdenum silicide, and the like; other compounds such as kaolin, clay, talc, diatomaceous earth, perlite, bentonite, mica, synthetic mica, and the like; and those compounds which have a heat cross linking group such as a COOH group, an isocyanate group, and the like, in an amount of at least 0.1 millimole per g. A COOH group and an isocyanate group are preferred. Specifically, it is possible to synthesize these fillers employing methods described in Japanese Patent Publication Open to Public Inspection Nos. 06-194837, 06-230573, and others.

Preferably, the aforementioned heat or light cross linking group containing inorganic or organic fine particles are substantially colorless. Their shapes are optional and may be amorphous or crystalline such as spherical, acicular, tabular, or prismatic. However, from the aspect of the uniformity of a filler added layer, the spherical shape is specifically preferred.

The preferred particle diameter of fillers varies depending on the thickness of a particle added photosensitive layer. However, the average particle diameter is commonly in the range of 0.01 to 10 μm (when particles are amorphous, the longest length of particles is employed), and is preferably between 0.01 and 2 μm.

Those, which are specifically preferred in the present invention, are fine filler particles having an average particle diameter of 0.5 μm or less. The average particle diameter as described in the present invention is a value which is determined by observing the layer surface employing an electron microscope. Regarding the relationship between the average particle diameter of fillers and the thickness of the layer, the particle diameter of fillers is specifically preferred to be less than the thickness of the layer comprising particles. Methods to incorporate fillers into the layer include one in which said fillers may directly be dispersed into the other components, or another one in which fillers which have been dispersed in a suitable dispersion medium may be added.

A layer comprising inorganic or organic fine particles containing a heat and/or light cross linking group, which is provided on a support, as shown in FIGS. 11 through 14, which show layer configurations, is preferably comprised of at least either a releasing layer or a hardening layer.

Further, the image recording material of the present invention is obtained by transferring the component layer to the support of the image recording material from the transfer foil and comprises the support for the image recording material having thereon the image receiving layer for forming an image, the releasing layer and the component layer. Still further, the releasing layer comprises inorganic or organic fine particles and satisfied the general formula described below:

1<(average diameter of said fine particles/thickness of said releasing layer)×100<400.

Further, the image receiving layer is a layer to record images and is provide on the support of the image recording material. Said image recording material is preferably a card. Incidentally, more preferable requirements are abbreviated since they are the same as the description of the aforementioned transfer foil.

Thickness of the transparent protective layer is preferably 0.1 to 50 μm. more preferably 0.5 to 50 μm, and particularly preferably 0.8 to 50 μm. In case that the transparent protective layer is the actinic light-hardened resinous layer, its thickness is preferably 0.1 to 50 μm, more preferably 1 to 30 μm, and particularly preferably 3 to 20 μm. In case that the transparent protective layer is the actinic light-hardened coating layer, its thickness is preferably 1 to 50 μm, more preferably 3 to 30 μm. and particularly preferably 5 to 50 μm. Thickness of the optical variable device layer is preferably 0.1 to 10 μm, more preferably 0.1 to 5.0 μm. Thickness of the inter layer is preferably 0.1 to 10 μm, more preferably 0.1 to 5 μm, and particularly preferably 0.1 to 3 μm. Thickness of the transparent protective layer is preferably 0.1 to 50 μm. more preferably 0.5 to 50 μm, and particularly preferably 0.8 to 50 μm. Thickness of the barrier layer is preferably 0.1 to 50 μm, more preferably 0.5 to 50 μm. and particularly preferably 0.8 to 50 μm. Thickness of the adhesive layer is preferably 0.1 to 50 μm, more preferably 0.5 to 50 μm, and particularly preferably 0.8 to 50 μm. Thickness of the support for the image recording material is preferably 10 to 1,000 μm, more preferably 50 to 800 μm, and particularly preferably 100 to 700 μm.

Figure 15:
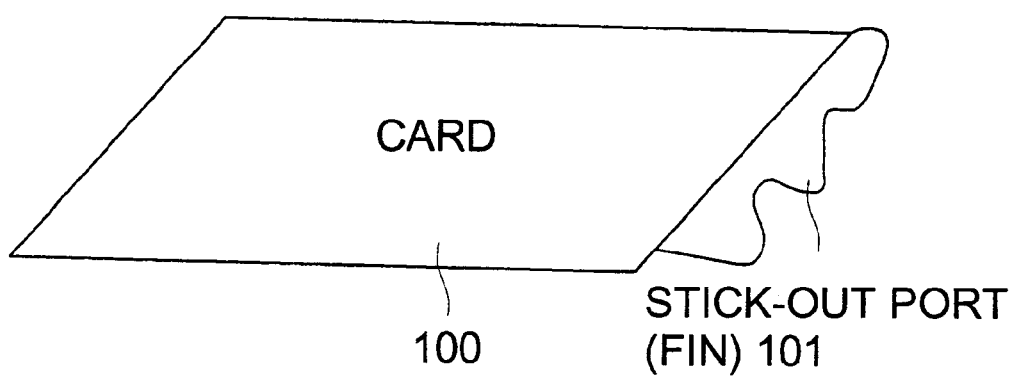
FIG. 15 shows the evaluation of fin properties.

Examples of the present invention will be described below. Table 1 shows an example of a hardening resinous layer (a protective layer providing agent) and Table 2 shows an example of fillers of the present invention, while Table 3 shows the evaluation results. FIG. 15 shows the evaluation of fin properties.

TABLE 1

Examples of Hardened Resinous Layers (Protective Layer Providing Agent)

| Binder Resin No. | Actinic light hardening Compounds (in weight parts) | Reaction Initiator | Unsaturated Group Containing Resin | Other Additives | Addition of Filler |
|---|---|---|---|---|---|
| 1 | Bis(3,4-epoxy-6-methylcyclohexylmethyl)adipate/bisphenol/glycidyl ether/1,4-butanediol glycidyl ether = 70/10/12.5 by parts | Triarylsulfonium fluoro antimony 7 parts | | Polydimethylsiloxane polymer 0.5 part | |
| 2 | PTMGA-250 manufactured by Kyoei Co./A-9300 manufactured by Shin-Nakamura Kagaku Co./Optomer 6210 manufactued by Sun Nobuco Co. = 10/27/9.75 by parts | Ilgacure 184 manufactured by Nihon Ciba-Geigy Co. 3 parts | Compound of Synthesis Example 1 50 parts | Dainippon Ink Surface Active Agent F-179 0.25 part | |
| 3 | A-9300 manufactured by Shin-Nakamura Kagaku Co./EA-1020 manufactured by Shin-Nakamura Kagaku Co. = 35/11.75 by parts | Ilgacure 184 manufactured by Nihon Ciba-Geigy Co. 3 parts | Compound of Synthesis Example 2 50 parts | Dainippon Ink Surface Active agent F-179 0.25 part | |

TABLE 1-continued

Examples of Hardened Resinous Layers (Protective Layer Providing Agent)

| Binder Resin No. | Actinic light hardening Compounds (in weight parts) | Reaction Initiator | Additives Unsaturated Group Containing Resin | Other Additives | Addition of Filler |
|---|---|---|---|---|---|
| 4 | A-9300 manufactured by Shin-Nakamura Kagaku Co./EA-1020 manufactured by Shin-Nakamura Kagaku Co. = 35/10.75 by parts | Ilgacure 184 manufactured by Nihon Ciba-Geigy Co. 3 parts | Compound of Synthesis Example 2 50 parts | Dainippon Ink Surface Active agent F-179 0.25 part | FX-G Series 4.5 μm 10 parts (Nippon Shokubai Co., LTD) free cross linking group organic filler |
| 5 | A-9300 manufactured by Shin-Nakamura Kagaku Co./EA-1020 manufactured by Shin-Nakamura Kagaku Co. = 35/10.75 by parts | Ilgacure 184 manufactured by Nihon Ciba-Geigy Co. 3 parts | Compound of Synthesis Example 2 50 parts | Dainippon Ink Surface Active agent F-179 0.25 part | Tosupearl 145 4.5 μm 10 parts (Toshiba Silicone Co., Ltd.) free-cross linking group inorganic filler |

TABLE 2

Fillers

| No. | Releasing Layer (in μm) | Releasing Layer Containing Filler | | Value obtained by General Formula (1) |
|---|---|---|---|---|
| 1 | 0.5 | 0.02 | MX020W (Nihon Shokubai) Organic Filler | 4 |
| 2 | 0.5 | 0.05 | NX050W (Nihon Shokubai) Organic Filler | 10 |
| 3 | 0.5 | 0.15 | MX100W (Nihon Shokubai) Organic Filler | 30 |
| 4 | 0.5 | 0.24 | W30 (Nihon Shokubai) Inorganic Filler | 48 |
| 5 | 0.5 | 5.00 | B-98052 (Gifu Cerac) Acrylureta Beads | 1000 |
| 6 | 0.5 | 2.20 | AMT Silica #200 (Mizusawa Kagaku) Inorganic Filler | 440 |

EXAMPLES

Synthesis Example 1

Preparation of the Resin of the Present Invention

Placed in a three-necked flask were 58 parts of methyl methacrylate, 30 parts of benzyl methacrylate, 12 parts of methacrylic acid, 500 parts of ethanol, and 3 parts of α,α'-azobisisobutylonitrile, and the resulting mixture underwent reaction in an oil bath under a flow of nitrogen at 80° C. for 6 hours. Thereafter, 3 parts of triethylammonium chloride and 0.6 part of glycidyl methacrylate were added, and the resulting mixture underwent reaction for 3 hours to obtain the targeted acryl based copolymer, Synthetic Binder 1.

Mw.: 21,000 Acid value: 62.9

Synthesis Example 2

Preparation of the Resin of the Present Invention

Placed in a three-necked flask were 40 parts of methyl methacrylate, 30 parts of benzyl methacrylate, 20 parts of cyclohexyl acrylate, 12 parts of methacrylic acid, 500 parts of ethanol, and 3 parts of α,α'-azobisisobutylonitrile, and the resulting mixture underwent reaction in an oil bath under a flow of nitrogen at 80° C. for 6 hours. Thereafter, 3 parts of triethylammonium chloride and 0.6 part of glycidyl methacrylate were added and the resulting mixture underwent reaction for 3 hours to obtain the targeted acryl based copolymer, designated as Synthetic Binder 2.

Mw: 22,000, Acid value: 63.1

EXAMPLES

The present invention will be detailed below with reference to examples. However, the present invention is not limited to these embodiments. Incidentally, "parts" in the following description is "weight parts", unless otherwise described.

Preparation of a Card on which a Portrait Image and Attribute Information as well as a Format Print are Provided (Preparation of Support)

A white polypropylene resin (Noburen FL25HA, manufactured by Mitsubishi Yuka Co., Ltd.) was applied onto both surfaces of a 350 μm thick polyethylene terephthalate (Tetron HS350, manufactured by Teijin Co., Ltd.) to obtain a thickness of 50 μm, employing an extrusion lamination method. One surface of said obtained composite resinous sheet was subjected to corona discharge treatment at 25 W/m²·minute. The resultant sheet was employed as a support.

(Preparation of Image Receiving Layer for Sublimation Type Thermally Transfer Recording)

A first image receiving layer forming coating composition, a second image receiving layer forming coating composition, and a third image receiving layer forming coating composition, having the compositions described below, were applied onto the corona discharge treated surface of the aforementioned support in said order, and subsequently dried so as to obtain a respective thickness of 0.2 μm, 2.5 μm. and 0.5 μm. Thus an image receiving layer was formed.

| <First Image Receiving Layer Forming Coating Composition> | |
|---|---|
| Polyvinyl butyral resin (Esurekku BL-1, manufactured by Sekisui Kagaku Kogyo Co., Ltd.) | 9 parts |
| Isocyanate (Coronate HX, manufactured by Nihon Polyurethane Kogyo Co., Ltd.) | 1 part |
| Methyl ethyl ketone | 80 parts |
| Butyl acetate | 10 parts |
| <Second Image Receiving Layer Forming Coating Composition> | |
| Polyvinyl butyral resin (Esurekku BX-1, manufactured by Sekisui Kagaku Kogyo Co., Ltd.) | 6 parts |
| Metal ion containing compound (Compound MS) | 4 parts |
| Methyl ethyl ketone | 80 parts |
| Butyl acetate | 10 parts |
| <Third Image Receiving Layer Forming Coating Composition> | |
| Polyethylene wax (Hitech E1000, manufactured by Toho Kagaku Kogyo Co., Ltd.) | 2 parts |
| Urethane modified ethylene-acrylic acid copolymer (Hitech S6254, manufactured by Toho Kagaku Kogyo Co., Ltd.) | 8 parts |
| Methyl cellulose (SM15, Shin-Etsu Kagaku Kogyo Co., Ltd.) | 0.1 part |
| Water | 90 parts |

Onto the resultant layer, a standard type format was provided through offset printing using a UV printing ink (FD-O Black, manufactured by Joto Ink). Further, onto the resultant layer, a transparent UV-hardening type OP varnish (FD-O Dry Coat Nisu, manufactured by Joto Ink) was applied in the area excluding the region for the sublimation thermal transfer image recording employing offset printing. Thus a base material for the ID card for the present invention was obtained. <Preparation of Writing Layer>

A Upo DFG-65 sheet manufactured by Oji Yuka Co., Ltd. was adhered to the opposite surface of the image receiving layer on the support, and a first writing layer forming coating composition, a second writing layer forming coating composition, and a third writing layer forming coating composition were applied in said order and subsequently dried to obtain a respective thickness of layers of 5 $\mu$m, 15 $\mu$m, and 0.2 $\mu$m. Thus an image receiving layer was formed.

| <First Writing Layer Forming Coating Composition> | |
|---|---|
| Polyester resin (Bairon 200, manufactured by Toyo Boseki Co., Ltd.) | 8 parts |
| Isocyanate (Coronate HX, manufactured by Nihon Polyurethane Kogyo Co., Ltd.) | 1 part |
| Carbon black | minute amount |
| Titanium dioxide particles (CR80 manufactured by Ishiwara Sangyo Co., Ltd.) | 1 part |
| Methyl ethyl ketone | 80 parts |
| Butyl acetate | 10 parts |
| <Second Writing Layer Forming Coating Composition> | |
| Polyester resin (Baironal MD1200, manufactured by Toyo Boseki Co., Ltd.) | 4 parts |
| Silica | 5 parts |
| Titanium dioxide particles (CR80 manufactured by Ishiwara Sangyo Co., Ltd.) | 1 part |
| Water | 90 parts |
| <Third Writing Layer Forming Coating Composition> | |
| Polyamide resin (Sanmaid 55, manufactured by Sanwa Kagaku Kogyo Co., Ltd.) | 5 parts |
| Methanol | 95 parts |

The central line average roughness of an obtained writing layer was 1.34 $\mu$m.

<Preparation of Ink Sheet for Sublimation Type Thermal Transfer Recording>

On a 6 $\mu$m thick polyethylene terephthalate sheet which had been subjected to melt prevention treatment on the opposite surface, a yellow ink layer forming coating composition, a magenta ink layer forming coating composition, and a cyan ink layer forming coating composition having the compositions described below were provided so as to obtain a thickness of each layer of 1 $\mu$m. Thus three-color ink sheet of yellow, magenta, and cyan was obtained.

| <Yellow Ink Layer Forming Coating Composition> | |
|---|---|
| Yellow dye (Compound Y-1) | 3 parts |
| Polyvinyl acetal (Denka Butyral KY-24, manufactured by Denkikagaku Kogyo Co., Ltd.) | 5.5 parts |
| Polymethyl methacrylate modified polystyrene (Rededa GP-200, manufactured by Toa Gosei Kagaku Kogyo Co., Ltd.) | 1 part |
| Urethane modified silicone oil (Daiaroma SP-21051 manufactured by Dainichiseika Kogyo Co., Ltd.) | 0.5 part |
| Methyl ethyl ketone | 70 parts |
| Toluene | 20 parts |
| <Magenta Ink Layer Forming Coating Composition> | |
| Magenta dye (Compound M-1) | 2 parts |
| Polyvinyl acetal (Denka Butyral KY-24, manufactured by Denkikagaku Kogyo Co., Ltd.) | 5.5 parts |
| Polymethyl methacrylate modified polystyrene (Rededa GP-200, manufactured by Toa Gosei Kagaku Kogyo Co., Ltd.) | 2 parts |
| Urethane modified silicone oil (Daiaroma SP-2105, manufactured by Dainichiseika Kogyo Co., Ltd.) | 0.5 part |
| Methyl ethyl ketone | 70 parts |
| Toluene | 20 parts |
| <Cyan Ink Layer Forming Coating Composition> | |
| Cyan dye (Compound C-1) | 1.5 parts |
| Cyan dye (Compound C-2) | 1.5 parts |
| Polyvinyl acetal (Denka Butyral KY-24, manufactured by Denkikagaku Kogyo Co., Ltd.) | 5.6 parts |
| Polymethyl methacrylate modified polystyrene (Rededa GP-200, manufactured by Toa Gosei Kagaku Kogyo Co., Ltd.) | 1 part |
| Urethane modified silicone oil (Daiaroma SP-2105, manufactured by Dainichiseika Kogyo Co., Ltd.) | 0.5 part |
| Methyl ethyl ketone | 70 parts |
| Toluene | 20 parts |

(Preparation of Ink Sheet for Melt Type Thermal Transfer Recording)

Onto a 6 μm thick polyethylene terephthalate sheet which had been subjected to melt prevention treatment on the opposite surface, an ink layer forming coating composition having the compositions described below was applied so as to obtain a thickness of each layer of 2 μm and subsequently dried. Thus an ink sheet was obtained.

| <Ink Layer Forming Coating Composition> | |
| --- | --- |
| Carnauba wax | 1 part |
| Ethylene-vinyl acetate copolymer (EV40Y, manufactured by Mitsui-Du Pont Chemical Co.) | 1 part |
| Carbon black | 3 parts |
| Phenol resin (Tamanol 521, manufactured by Arakawa Kagaku Kogyo Co., Ltd.) | 5 parts |
| Methyl ethyl ketone | 90 parts |

(Formation of Portrait Image)

An image receiving layer was faced with the ink side of the ink sheet for the sublimation type thermal transfer recording and was heated from the ink sheet side under conditions of an output of 0.23 W/dot, a pulse width of 0.3 to 4.5 millisecond, and a dot density of 16 dots/mm, employing a thermal head. Thus a person's portrait image having gradation wag formed on said image receiving layer. In said image, the aforementioned dye and nickel in the image receiving layer form a complex.

(Formation of Text Information)

An OP varnish section was faced with the ink side of the ink sheet for melt type thermal transfer recording, and was heated from the ink sheet side under conditions of an output of 0.5 W/dot, a pulse width of 1.0 millisecond, and a dot density of 16 dots/mm, employing a thermal head. Thus said text information was formed on said OP varnish.

Employing a protective foil prepared by coating a thermal adhesive resin having Composition 1 described below onto a 25 μl thick PET, said 2.5μ thick transparent protective layer was transferred onto the surface of said recorded card to form an ID card.

A card, in which the format of a portrait image and attribute information were provided, was prepared as described above.

Preparation of Transfer Foil 1

A releasing layer, an interlayer, and an adhesive layer, having the formulas described below, were applied onto one side of polyethylene terephthalate (S-25) manufactured by Daiafoil-Hoechst Co., Ltd., employing wire bar coating and subsequently dried to obtain Transparent Protective Layer Transfer Foil 1.

| (Releasing Layer) Layer thickness: | 0.5 μm |
| --- | --- |
| Acryl based resin (Dianar BR-87, manufactured by Mitsubishi Rayon Co., Ltd.) | 4.5 parts |
| Vinyl acetoacetal (having a SP value of 9.4, KS-1 manufactured by Sekisui Kagaku Co., Ltd.) | 4.5 parts |
| FX-GSZ-07 (having a particle diameter of 0.7 μm) light cross linking group containing organic filler (manufactured by Nippon Shokubai Co., Ltd.) | 1 part |
| Methyl ethyl ketone | 40 parts |
| Toluene | 50 parts |
| (Interlayer) Layer thickness: | 2 μm |
| Styrene based resin (Septon 2006) | 5 parts |
| Polyvinyl butyral resin (BL-S, manufactured by Sekisui Kagaku Co., Ltd.) | 5 parts |
| Toluene | 90 parts |
| (Adhesive Layer) Layer thickness: | 2 μm |
| Styrene based resin (Toughtech M-1953, manufactured by Asahi Kasei Co., Ltd.) | 6 parts |
| Alicyclic saturated hydrocarbon resin (Arukon P100, manufactured by Arakawa Kagaku Co., Ltd.) | 3.5 parts |
| Calcium carbonate (Tamapearl TP-123, manufactured by Okutama Kogyo Co., Ltd.) | 0.5 part |
| Toluene | 90 parts |

Transfer Foil 1, which was comprised of the releasing layer, interlayer, adhesive layer having the aforementioned compositions, was prepared.

Further, on the aforementioned image- and text-recorded image receiving material, transfer foils described in each example and comparative example, which was comprised as described above, was employed and heated to a surface temperature of 200° C. Transfer was then carried out employing a 5 cm diameter heated roller having a rubber hardness of 85 under a pressure of 150 kg/cm² for 1.2. seconds.

Example 1

Said ultraviolet ray hardening resin containing coating composition was applied onto said image receiving material 1 onto which said Transfer Foil 1 had been transferred so as to obtain a coated amount of 20 g/m², employing a gravure roll coater having a specified group design, and an ultraviolet ray hardening protective layer was formed by hardening Binder Resin Layer 1 (in Table 1) in the ultraviolet hardening resin containing coating composition under the conditions described below.

Hardening Conditions

Light emitting source: high pressure mercury lamp of 60 W/cm²

Irradiated distance: 10 cm

Irradiation mode: light scanning at 3 cm/second

Evaluation Method

Each sample, which was prepared employing said method, was subjected to evaluation of scratch resistance.

Preparation of Transfer Foil 2

A releasing layer, an interlayer, and an adhesive layer, having the formulas described below, were applied onto one side of polyethylene terephthalate (S-25) manufactured by Daiafoil-Hoechst Co., Ltd., employing wire bar coating and subsequently dried to obtain Transparent Protective Layer Transfer Foil 2.

| (Releasing Layer) Layer thickness: | 0.5 μm |
| --- | --- |
| Acryl based resin (Dianar BR-87, manufactured by Mitsubishi Rayon Co., Ltd.) | 4.5 parts |
| Vinyl acetoacetal (having a SP value of 9.4, KS-1 manufactured by Sekisui Kagaku Co., Ltd.) | 4.5 parts |
| FX-GSZ-07 (having a particle diameter of 0.7 μm) light cross linking group containing organic filler (manufactured by Nippon Shokubai Co., Ltd.) | 1 part |

-continued

| | |
|---|---|
| Methyl ethyl ketone | 40 parts |
| Toluene | 50 parts |
| (Optical Variable Device Layer) Layer thickness:<br>Hologram image | 2 µm |
| (Adhesive Layer) layer thickness: | 2 µm |
| Styrene based resin (Toughteck M-19131<br>manufactured by Asahi Kasei Co.,<br>Ltd.) | 6 parts |
| Alicyclic saturated hydrocarbon resin<br>(Arukon P1000, manufactured by<br>Arakawa Kagaku<br>Co., Ltd.) | 3.5 parts |
| Calcium carbonate (Tamapearl TF-1231<br>manufactured by Okutama Xogyo Co.,<br>Ltd.) | 0.5 part |
| Toluene | 90 parts |

Transfer Foil 2, which was comprised of the releasing layer, hologram image layer, and adhesive layer having the aforementioned compositions, was prepared.

Further, on the aforementioned image- and text-recorded image receiving material, transfer foils described in each example and comparative example, which was comprised as described above, was employed and heated to a surface temperature of 200 ° C. Transfer was then carried out employing a 5 cm diameter heated roller having a rubber hardness of 85 under a pressure of 150 kg/cm² for 1.2 seconds.

Example 2

Said ultraviolet ray hardening resin containing coating composition was applied onto said image receiving material onto which said Transfer Foil 2 had been transferred so as to obtain a coated amount of 20 g/m²,employing a gravure roll coater having a specified ground design, and an ultraviolet ray hardening protective layer was formed by hardening Binder Resin Layer 1 (in Table 1) in the ultraviolet hardening resin containing coating composition under the conditions described below.

Hardening Conditions

Light emitting source: high pressure mercury lamp of 60 W/cm²

Irradiated distance: 10 cm

Irradiation mode: light scanning at 3 cm/second

Evaluation Method

Each sample, which was prepared employing said method, was subjected to evaluation of scratch resistance.

Example 3
Preparation of Protection Providing Transfer Foil

A releasing layer coating composition, an actinic light hardening layer forming coating composition, an interlayer forming coating composition, and an adhesive layer forming coating composition were applied onto one side of polyethylene terephthalate (S-25) manufactured by Daiafoil-Hoechst Co., Ltd. in said order and subsequently dried to prepare a thermal transfer foil.

| (Releasing Layer Forming Coating Composition) | |
|---|---|
| Layer Thickness | 0.5 µm |
| Polyvinyl alcohol (GL-05, manufactured<br>by Nihon Gosei Kagaku Co., Ltd.) | 90 parts |

| (Releasing Layer Forming Coating Composition) | |
|---|---|
| SX-8742(B) light crosslinking group<br>containing organic filler 0.03 µm<br>(manufactured by Nihon Gosei Gomu<br>Co., Ltd.)<br>Water | 10 parts |

<Actinic Light Hardening Layer Forming Coating Composition>

Binder Resins 2 and 3 in Table 1 were used.

Hardening after coating was carried out at an irradiation distance of 18 cm employing a high pressure mercury lamp of 160 W/cm².

The coated layer thickness was 8.0 µm.

<Interlayer Forming Coating Composition>Layer thickness: 1.0 µm

| | |
|---|---|
| BX-1 (polyvinyl butyral resin)<br>(Esurekkusu B Series, manufactured<br>by Sekisui Kagaku Co., Ltd.) | 9 parts |
| Methyl ethyl ketone | 90 parts |
| Coronate HX (manufactured by Nihon<br>Polyurethane Co., Ltd.) | 1 part |

During addition of the hardener, hardening was carried out at 50° C. for 24 hours.

| <Adhesive Layer Forming Coating Composition> | |
|---|---|
| Layer thickness: | 0.5 µm |
| Urethane modified ethylene-ethyl acrylate<br>copolymer (Hitech S6254B,<br>manufactured by Toho Kagaku<br>Kogyo Co., Ltd.) | 8 parts |
| Polyacrylic acid ester copolymer<br>(Jurimar AT510, manufactured<br>by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

Example 4
Preparation of Protection Providing Transfer Foil

A releasing layer coating composition, an actinic light hardening layer forming coating composition, an interlayer forming coating composition, a barrier layer coating composition, and an adhesive layer forming coating composition were multilayed in said order onto one side of polyethylene terephthalate (S-25) manufactured by Daiafoil-Hoechst Co., Ltd., and subsequently dried to prepare a thermal transfer foil.

| (Releasing Layer Forming Coating Composition) | |
| --- | --- |
| Layer Thickness | 0.5 μm |
| Polyvinyl alcohol (GL-051 manufactured by Nihon Gosei Kagaku Co., Ltd.) | 90 parts |
| SX-8742(B) light cross linking group containing organic filler 0.03 μm (manufactured by Nihon Gosei Gomu Co., Ltd.) | |
| Water | 10 parts |

<Actinic Light Hardening Layer Forming Coating Composition>

Binder Resin layers 2 and 3 in Table 1 were used.

Hardening after coating was carried out at an irradiation distance of 18 cm employing a high pressure mercury lamp of 160 W/cm.

The coated layer thickness was 8.0 μm.

| <Interlayer Forming Coating Composition> | |
| --- | --- |
| Layer thickness: | 1.0 μm |
| BX-1 (polyvinyl butyral resin) (Esurekkusu B Series, manufactured by Sekisui Kagaku Co., Ltd.) | 9 parts |
| Methyl ethyl ketone | 90 parts |
| Coronate HX (manufactured by Nihon Polyurethane Co., Ltd.) | 1 part |

During addition of the hardener, hardening was carried out at 50° C. for 24 hours.

| <Barrier Layer Forming Coating Composition> | |
| --- | --- |
| Layer thickness: | 1.8 μm |
| Styrene based resin (Toughtech M-1913, manufactured by Asahi Kasei Co., Ltd.) | 10 parts |
| <Adhesive Layer Forming Coating Composition> | |
| Layer thickness: | 0.5 μm |
| Urethane modified ethylene-ethyl acrylate copolymer (Hitech S6254B, manufactured by Toho Kagaku Kogyo Co., Ltd.) | 8 parts |
| Polyacrylic acid ester copolymer (Jurimar AT510, manufactured by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

Example 5
Preparation of Protection Providing Transfer Foil

A releasing layer 2 coating composition, an actinic light hardening layer forming coating composition, an interlayer forming coating composition, a barrier layer forming coating layer, and an adhesive layer forming coating composition were multilayered in said order onto the releasing layer on a 20 μm thick polyethylene terephthalate film 2, provided with said releasing layer comprised of a 0.1 μm thick fluorine resin layer, and subsequently dried to prepare a thermal transfer foil.

| (Releasing Layer 2 Forming Coating Composition> | |
| --- | --- |
| Layer Thickness | 0.5 μm |
| Polyvinyl alcohol (GL-05, manufactured by Nihon Gosei Kagaku Co., Ltd.) | 90 parts |
| SX-8742(B) light cross linking group containing organic filler 0.03 μm (manufactured by Nihon Gosei Gomu Co., Ltd.) | 10 parts |
| Water | |

<Actinic Light Hardening Layer Forming Coating Composition>

Binder resin layers 2 and 3, shown in Table 1 were employed.

Hardening after coating was carried out in such a manner that a high pressure mercury lamp of 160 W/cm$^2$ was employed at an irradiation distance of 18 cm and a light scanning at a CS of 5 m.

The coated layer thickness was 8.0 μm.

| <Interlayer Forming Coating Composition> | |
| --- | --- |
| Layer thickness: | 1.0 μm |
| BX-1 (polyvinyl butyral resin) (Esurekkusu B Series, manufactured by Sekisui Kagaku Co., Ltd.) | 9 parts |
| Methyl ethyl ketone | 90 parts |
| Coronate HX (manufactured by Nihon Polyurethane Co., Ltd.) | 1 part |

During addition of the hardener, hardening was carried out at 50° C. for 24 hours.

| <Barrier Layer Forming Coating Composition> | |
| --- | --- |
| Layer thickness: | 1.8 μm |
| Nipporan N3109 (manufactured by Nihon Polyurethane Co., Ltd.) | 90 parts |
| Tosupearl 120 (manufactured by Toshiba Silicone Co., Ltd.) | 1 part |
| <Adhesive Layer Forming Coating Composition> | |
| Layer thickness: | 0.5 μm |
| Urethane modified ethylene-ethyl acrylate copolymer (Hitech S6254B, manufactured by Toho Kagaku Kogyo Co., Ltd.) | 8 parts |
| Polyacrylic acid ester copolymer (Jurimar AT510, manufactured by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

Example 6

Preparation of Protection Providing Transfer Foil

An actinic light hardening layer forming coating composition, an interlayer forming coating composition, a barrier layer forming coating layer, and an adhesive layer forming coating composition were multilayered in said order onto the releasing layer on a 20 $\mu$m thick polyethylene terephthalate film 2, provided with said releasing layer comprised of a 0.1 $\mu$m thick fluorine resin layer, and subsequently dried to prepare a thermal transfer foil.

<Actinic light hardening Layer Forming Coating Composition>

Binder resin layer 4 shown in Table 1, was employed.

Hardening after coating was carried out in such a manner that a high pressure mercury lamp of 160 W/cm² was employed at an irradiation distance of 18 cm and a light scanning at a CS of 5 m.

The coated layer thickness was 8.0 $\mu$m.

| <Interlayer Forming Coating Composition> | |
|---|---|
| Layer thickness: | 1.0 $\mu$m |
| BX-1 (polyvinyl butyral resin) | |
| (Esurekkusu B Series, manufactured by Sekisui Kagaku Co., Ltd.) | 9 parts |
| Methyl ethyl ketone | 90 parts |
| Coronate HX (manufactured by Nihon Polyurethane Co., Ltd.) | 1 part |

During addition of the hardener, hardening was carried out at 50° C. for 24 hours.

| <Barrier Layer Forming Coating Composition> | |
|---|---|
| Layer thickness: | 1.8 $\mu$m |
| Nipporan N3109 (manufactured by Nihon Polyurethane Co., Ltd.) | 90 parts |
| Tosupearl 120 (manufactured by Toshiba Silicone Co., Ltd.) | 1 part |
| <Adhesive Layer Forming Coating Composition> | |
| Layer thickness: | 0.5 $\mu$m |
| Urethane modified ethylene-ethyl acrylate copolymer (Hitech S6254B, manufactured by Toho Kagaku Kogyo Co., Ltd.) | 8 parts |
| Polyacrylic acid ester copolymer (Jurimar AT510, manufactured by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

Example 7

Preparation of Protection Providing Transfer Foil

A releasing layer 2 coating composition, an actinic light hardening layer forming coating composition, an interlayer forming coating composition, a barrier layer forming coating layer, and an adhesive layer forming coating composition were multilayered in said order onto the releasing layer on a 20 $\mu$m thick polyethylene terephthalate film 2, provided with said releasing layer comprised of a 0.1 $\mu$m thick fluorine resin layer, and subsequently dried to prepare a thermal transfer foil.

| (Releasing Layer 2 Forming Coating Composition> | |
|---|---|
| Layer Thickness | 0.5 $\mu$m |
| Polyvinyl alcohol (GL-05, manufactured by Nihon Gosei Kagaku Co., Ltd.) | 90 parts |
| SX-8742(B) light cross linking group containing organic filler 0.03 $\mu$m (manufactured by Nihon Gosei Gomu Co., Ltd.) | 10 parts |
| Water | |

<Actinic Light Hardening Layer Forming Coating Composition>

Binder resin layer 4, shown in Table 1, was employed.

Hardening after coating was carried out in such a manner that a high pressure mercury lamp of 160 W/cm² was employed at an irradiation distance of 18 cm and a light scanning at a CS of 5 m.

The coated layer thickness was 8.0 $\mu$m.

| <Interlayer Forming Coating Composition> | |
|---|---|
| Layer thickness: | 1.0 $\mu$m |
| BX-1 (polyvinyl butyral resin) | 9 parts |
| (Esurekkusu B Series, manufactured by Sekisui Kagaku Co., Ltd.) | |
| Methyl ethyl ketone | 90 parts |
| Coronate HX (manufactured by Nihon Polyurethane Co., Ltd.) | 1 part |

During addition of the hardener, hardening was carried out at 50° C. for 24 hours.

| <Barrier Layer Forming Coating Composition> | |
|---|---|
| Layer thickness: | 1.8 $\mu$m |
| Nipporan N3109 (manufactured by Nihon Polyurethane Co., Ltd.) | 90 parts |
| Tosupearl 120 (manufactured by Toshiba Silicone Co., Ltd.) | 1 part |
| <Adhesive Layer Forming Coating Composition> | |
| Layer thickness: | 0.5 $\mu$m |
| Urethane modified ethylene-ethyl acrylate copolymer (Hitech S6254B, manufactured by Toho Kagaku Kogyo Co., Ltd.) | 8 parts |
| Polyacrylic acid ester copolymer (Jurimar AT5101 manufactured by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

Example 8
Preparation of Protection Providing Transfer Foil

A releasing layer 2 coating composition, an actinic light hardening layer forming coating composition, an interlayer forming coating composition, a barrier layer forming coating layer, and an adhesive layer forming coating composition were multilayered in said order onto the releasing layer on a 20 μm thick polyethylene terephthalate film 2, provided with said releasing layer comprised of a 0.1 μm thick fluorine resin layer, and subsequently dried to prepare a thermal transfer foil.

| (Releasing Layer 2 Forming Coating Composition) | |
|---|---|
| Layer Thickness | 0.5 μm |
| Polyvinyl alcohol (GL-05, manufactured by Nihon Gosei Kagaku Co., Ltd.) | 90 parts |
| SX-8742(B) light cross linking group containing organic filler 0.03 μm (manufactured by Nihon Gosei Gomu Co., Ltd.) | 10 parts |
| Water | |

<Actinic Light Hardening Layer Forming Coating Composition>

Binder resin layer 4, shown in Table 1

Hardening after coating was carried out in such a manner that a high pressure mercury lamp of 160 w/cm² was employed at an irradiation distance of 18 cm and a light scanning at a CS of 5 m.

The coated layer thickness was 8.0 μm.

| (Optical Variable Device Layer) Layer thickness: | 2 μm |
|---|---|
| Hologram image | |
| <Interlayer Forming Coating Composition> | |
| Layer thickness: | 1.0 μm |
| BX-1 (polyvinyl butyral resin) (Esurekkusu B Series, manufactured by Sekisui Kagaku Co., Ltd.) | 8 parts |
| Methyl ethyl ketone | 90 parts |
| Coronate HX (manufactured by Nihon Polyurethane Co., Ltd.) | 2 part |

During addition of the hardener, hardening was carried out at 50° C. for 24 hours.

| <Barrier Layer Forming Coating Composition> | |
|---|---|
| Layer thickness: | 0.5 μm |
| Toughtech 1913 (manufactured by Asahi Kasei Co., ltd.) | 10 parts |

| <Adhesive Layer Forming Coating Composition> | |
|---|---|
| Layer thickness: | 0.5 μm |
| Urethane modified ethylene-ethyl acrylate copolymer (Hitech S6254B, manufactured by Toho Kagaku Kogyo Co., Ltd.) | 8 parts |
| Polyacrylic acid ester copolymer (Jurimar AT5101 manufactured by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

Example 9
Preparation of Protection Providing Transfer Foil

An actinic light hardening layer forming coating composition, a hologram layer, an interlayer forming coating composition, a barrier layer coating layer, and an adhesive layer forming coating composition were multilayered in said order onto the releasing layer on a 20 μm thick polyethylene terephthalate film 2, provided with said releasing layer comprised of a 0.1 μm thick fluorine resin layer, and subsequently dried to prepare a thermal transfer foil.

<Actinic Light Hardening Layer Forming coating composition>

Binder resin layer 4, shown in Table 1

Hardening after coating was carried out in such a manner that a high pressure mercury lamp of 160 W/cm² was employed at an irradiation distance of 18 cm and a light scanning at a CS of 5 m.

The coated layer thickness was 8.0 μm.

| (Optical Variable Device Layer) | |
|---|---|
| Layer thickness: | 2 μm |
| Hologram image | |
| <Interlayer Forming Coating Composition> | |
| Layer thickness: | 1.0 μm |
| BX-1 (polyvinyl butyral resin) (Esurekkusu B Series, manufactured by Sekisui Kagaku Co., Ltd.) | 8 parts |
| Methyl ethyl ketone | 90 parts |
| Coronate HX (manufactured by Nihon Polyurethane Co., Ltd.) | 2 part |

During addition of the hardener, hardening was carried out at 50° C. for 24 hours.

| <Barrier Layer Forming Coating Composition> | |
|---|---|
| Layer Thickness: | 0.5 μm |
| Toughtech 1913 (manufactured by Asahi Kasei Co., ltd.) | 10 parts |

-continued

| <Adhesive Layer Forming Coating Composition> | |
|---|---|
| Layer thickness: | 0.5 μm |
| Urethane modified ethylene-ethyl acrylate copolymer (Hitech S6254B, manufactured by Toho Kagaku Kogyo Co., Ltd.) | 8 parts |
| Polyacrylic acid ester copolymer (Jurimar ATS10, manufactured by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer-layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

Example 10

Preparation of Protection Providing Transfer Foil

A releasing layer 2 coating composition, an actinic light hardening layer forming coating composition, an interlayer forming coating composition, a barrier layer forming coating layer, and an adhesive layer forming coating composition were multilayered in said order onto the releasing layer on a 20 μm thick polyethylene terephthalate film 2, provided with said releasing layer comprised of a 0.1 μm thick fluorine resin layer, and subsequently dried to prepare a thermal transfer foil.

| (Releasing Layer 2 Forming Coating Composition) | |
|---|---|
| Layer thickness: | 0.5 μm |
| Polyvinyl alcohol (GL-051 manufactured by Nihon Gosei Kagaku Co., Ltd.) | 90 parts |

SX-8742(B) Light Cross Linking Group

Fillers (1 through 6) having particle diameter described in Table 2 of FIG. 1 were employed.

Incidentally, fillers 1 though 3 have a heat cross linking group and/or a light cross linking group, while fillers 4 through 6 do not have a heat cross linking group and/or a light cross linking group.

Water 10 parts
<Actinic Light Hardening Layer Forming Coating Composition>

Binder resin layer 3, shown in Table 1

Hardening after coating was carried out in such a manner that a high pressure mercury lamp of 160 W/cm$^2$ was employed at an irradiation distance of 18 cm and a light scanning at a CS of 5 m.

The coated layer thickness was 8.0 μm.

| <Interlayer Forming Coating Composition> | |
|---|---|
| Layer thickness: | 1.0 μm |
| BX-1 (polyvinyl butyral resin) (Esurekkusu B Series, manufactured by Sekisui Kagaku Co., Ltd.) | 8 parts |

-continued

| <Interlayer Forming Coating Composition> | |
|---|---|
| Methyl ethyl ketone | 90 parts |
| Coronate HX (manufactured by Nihon Polyurethane Co., Ltd.) | 2 parts |

During additions of the hardener, hardening was carried out at 50° C. for 24 hours.

| <Barrier Layer Forming Coating Composition> | |
|---|---|
| Layer thickness: | 0.5 μm |
| Toughtech 1913 (manufactured by Asahi Kasei Co., Ltd.) | 10 parts |
| <Adhesive Layer Forming Coating Composition> | |
| Layer thickness: | 0.5 μm |
| Urethane modified ethylene-ethyl acrylate copolymer (Hitech S6254B, manufactured by Toho Kagaku Kogyo Co., Ltd.) | 8 parts |
| Polyacrylic acid ester copolymer (Jurimar AT510, manufactured by Nihon Junyaku Co., Ltd.) | 2 parts |
| Water | 45 parts |
| Ethanol | 45 parts |

Formation of Protective Layer onto Card

The recording surface of the card prepared in Table 1 was faced with the transfer layer surface of a thermal transfer sheet. Then the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card.

(Method for Evaluating Scratch Resistance (Wear Resistance))

A wear resistance tester (Heidon-18) was employed. Each surface of prepared cards and forgery alteration preventing cards was slid with a 0.1 mmφ sapphire needle under varying loads of 200 g to 300 g. At that time, the portions, at which abrasion was caused, were observed, and the loading, which resulted in the abrasion, was recorded. Table 3 shows the results.

(Method for Evaluating Fin Properties)

As described in the aforementioned examples, the surface of a heated roller, which was prepared by attaching silicone rubber (having a rubber hardness of 80) around a outer diameter 3 cm metal roller, was heated at 190° C. The thermal transfer sheet was pressed with said roller and transfer was carried out under conditions of a transfer speed of 23 mm/second, and a linear load of 10 kg/cm. Thereafter, the support of the thermal transfer sheet was peeled off to form a protective layer on the card, and then a part 101 which stuck out from the card surface section 100, as shown in FIG. 15, was evaluated.

A: the card having a fin of 1 mm or less

B: the card having a fin of 1 mm or more

C: the card having a fin of 3 mm or more

Table 3 shows the results in which when 50 sheets were subjected to thermal transfer, and the number of "A"s is shown in figure.

TABLE 3

| Example No. | Protective Transfer Foil Transfer 1st Foil | Protective Transfer Foil Transfer 2nd Foil | Hardening Resin Layer No. | Example No. | Filler No. |
|---|---|---|---|---|---|
| Example 1 | Transfer Foil 1 | | 1 | 1 | — |
| Example 2 | Transfer Foil 2 | | 1 | 2 | — |
| Example 3 | Example 3 Transfer Foil (No. 2 Hardening Layer) | | 2 | 3 | — |
| Example 4 | Example 3 Transfer Foil (No. 3 Hardening Layer) | | 3 | 3 | — |
| Example 5 | Example 4 Transfer Foil (No. 2 Hardening Layer) | | 2 | 4 | — |
| Example 6 | Example 4 Transfer Foil (No. 3 Hardening Layer) | | 3 | 4 | — |
| Example 7 | Example 5 Transfer Foil (No. 2 Hardening Layer) | | 2 | 5 | — |
| Example 8 | Example 5 Transfer Foil (No. 3 Hardening Layer) | | 3 | 5 | — |
| Comparative Example 1 | Example 6 Transfer Foil (No. 5 Hardening Layer) | | 5 | 6 | — |
| Example 9 | Example 8 Transfer Foil (No. 4 Hardening Layer) | | 4 | 8 | — |
| Example 10 | Example 8 Transfer Foil (No. 4 Hardening Layer) | | 4 | 8 | — |
| Comparative Example 2 | Example 9 Transfer Foil (No. 5 Hardening Layer) | | 5 | 9 | — |
| Example 11 | Example 10 Transfer Foil (No. 3 Hardening Layer) | | 3 | 10 | 1 |
| Example 12 | Example 10 Transfer Foil (No. 3 Hardening Layer) | | 3 | 10 | 2 |
| Example 13 | Example 10 Transfer Foil (No. 3 Hardening Layer) | | 3 | 10 | 3 |
| Example 14 | Example 10 Transfer Foil (No. 3 Hardening Layer) | | 3 | 10 | 4 |
| Comparative Example 3 | Example 10 Transfer Foil (No. 3 Hardening Layer) | | 3 | 10 | 5 |
| Comparative Example 4 | Example 10 Transfer Foil (No. 3 Hardening Layer) | | 3 | 10 | 6 |
| Example 15 | Example 5 Transfer Foil (No. 2 Hardening Layer) | Example 5 Transfer Foil (No. 3 Hardening Layer) | 2, 3 | 5 | — |
| Example 16 | Example 5 Transfer Foil (No. 2 Hardening Layer) | Example 5 Transfer Foil (No. 2 Hardening Layer) | 2 | 5 | — |
| Example 17 | Transfer Foil 1 | Example 5 Transfer Foil (No. 3 Hardening Layer) | 3 | 1, 5 | — |
| Example 18 | Transfer Foil 2 | Example 5 Transfer Foil (No. 3 Hardening Layer) | 3 | 1, 5 | — |

| Example No. | Image Recording Medium No. Used Image Recording Body Preparation Apparatus (Drawing No.) | Scratch Resistance 0.1 mm sapphire needle | Evaluation of Fin Properties (the number of OKs/50 trials) 1st Transfer | Evaluation of Fin Properties (the number of OKs/50 trials) 2nd Transfer | Formula related to General Formula (1) 1st Transfer | Formula related to General Formula (1) 2nd Transfer |
|---|---|---|---|---|---|---|
| Example 1 | 1 | 270 | 39 | | 140 | |
| Example 2 | 1 | 253 | 41 | | 140 | |
| Example 3 | 3 | 221 | 46 | | 6 | |
| Example 4 | 3 | 243 | 46 | | 6 | |
| Example 5 | 3 | 254 | 45 | | 6 | |
| Example 6 | 3 | 261 | 46 | | 6 | |
| Example 7 | 3 | 271 | 48 | | 6 | |
| Example 8 | 3 | 287 | 49 | | 6 | |
| Comparative Example 1 | 3 | 189 | 36 | | 0 | |
| Example 9 | 3 | 288 | 50 | | 6 | |
| Example 10 | 3 | 291 | 49 | | 6 | |
| Comparative Example 2 | 9 | 178 | 32 | | 0 | |
| Example 11 | 3 | 293 | 48 | | 6 | |
| Example 12 | 3 | 291 | 48 | | 20 | |
| Example 13 | 3 | 286 | 50 | | 40 | |
| Example 14 | 3 | 287 | 50 | | 60 | |

TABLE 3-continued

| | | | | |
|---|---|---|---|---|
| Comparative Example 3 | 3 | problematic appearance of the card | problematic appearance of the card | 1000 |
| Comparative Example 4 | 3 | problematic appearance of the card | problematic appearance of the card | 440 |
| Example 15 | 7 | >300 | 48, 49 | 6, 6 |
| Example 16 | 7 | >300 | 48, 48 | 6, 6 |
| Example 17 | 5 | >300 | 39, 48 | 0, 6 |
| Example 18 | 5 | >300 | 41, 48 | 0, 6 |

As described above, according to the transfer foil, the method for preparing an image recording material, and the method for preparing said transfer foil, it is possible to enhance security by discouraging forgery, alteration, and the like, and to enhance scratch resistance compared to conventional system and to minimize the formation of flaws as well as wrinkles.

Further, it is possible to minimize the formation of fins which stick out from the edge during cutting an image recording material into a card shape.

"Disclosed embodiments can be varied by a skilled person without departing from the spirit and scope of the present invention."

What is claimed is:

1. A transfer foil comprising a support, a releasing layer and a component layer wherein the releasing layer contains inorganic or organic fine particles and 1<(average particle diameter of the inorganic or organic fine particle in releasing layer/thickness of releasing layer)×100<400, and wherein the inorganic or organic fine particles comprise a heat cross linking group or a light cross linking group.

2. The transfer foil of claim 1 wherein the heat cross linking group or the light cross linking group comprises at least one of a vinyl group, an acryloyl group, a methacryloyl group, a glycidyl group, an isocyanate group, or a carboxyl group.

3. The transfer foil of claim 1 wherein an average particle diameter of the inorganic or organic fine particles is 0.01 to 10 μm.

4. The transfer foil of claim 3 wherein the heat cross linking group or the light cross linking group comprises at least one of a vinyl group, an acryloyl group, a methacryloyl group, a glycidyl group, an isocyanate group, or a carboxyl group.

5. The transfer foil of claim 1 wherein the component layer includes at least one of an adhesion layer, a transparent protective layer and an optical variable device layer.

6. An image recording material having a component layer transferred from a transfer foil to a support for the image recording material comprising the support for the image recording material, an image receiving layer, a releasing layer and a component layer, wherein the releasing layer contains inorganic or organic fine particles and 1<(average particle diameter of the inorganic or organic fine particle in releasing layer/thickness of releasing layer.)×100<400, and wherein the inorganic or organic fine particles comprise a heat cross linking group or a light cross linking group.

7. The transfer foil of claim 6 wherein the heat cross linking group or the light cross linking group comprises at least one of a vinyl group, an acryloyl group, a methacryloyl group, a glycidyl group, an isocyanate group, or a carboxyl group.

* * * * *